US012222378B2

(12) United States Patent
Wang et al.

(10) Patent No.: US 12,222,378 B2
(45) Date of Patent: Feb. 11, 2025

(54) RIPPLE DETECTION DEVICE AND RIPPLE SUPPRESSION DEVICE

(71) Applicant: ZTE CORPORATION, Guangdong (CN)

(72) Inventors: Qia Wang, Guangdong (CN); Jianping Zhou, Guangdong (CN); Guoxian Lin, Guangdong (CN); Shanshan Fan, Guangdong (CN); Ben E, Guangdong (CN); Wei Zhang, Guangdong (CN); Mingming Liu, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 248 days.

(21) Appl. No.: 18/013,236

(22) PCT Filed: Jun. 28, 2021

(86) PCT No.: PCT/CN2021/102694
§ 371 (c)(1),
(2) Date: Dec. 27, 2022

(87) PCT Pub. No.: WO2022/001938
PCT Pub. Date: Jan. 6, 2022

(65) Prior Publication Data
US 2023/0273247 A1 Aug. 31, 2023

(30) Foreign Application Priority Data
Jun. 28, 2020 (CN) .......... 202010602401.X

(51) Int. Cl.
*H02M 1/14* (2006.01)
*G01R 19/25* (2006.01)

(52) U.S. Cl.
CPC ..... *G01R 19/2509* (2013.01); *G01R 19/2513* (2013.01); *H02M 1/14* (2013.01)

(58) Field of Classification Search
CPC .... G01R 19/2513; G01R 19/22; G01R 19/18; G01R 19/2509; H02M 1/14; H02M 1/143; H02M 1/15; H02M 1/32; H02M 1/12123
See application file for complete search history.

(56) References Cited

U.S. PATENT DOCUMENTS 9,250,640 B1 * 2/2016 Chakraborty ........... H02M 1/14
11,245,331 B2 * 2/2022 Wang ..................... H02M 7/003
(Continued)

FOREIGN PATENT DOCUMENTS

JP     H 0865161 A     3/1996
JP     2003088140 A     3/2003
(Continued)

OTHER PUBLICATIONS

European Patent Office, EP21832361.6 Extended European Search Report issued on Jun. 21, 2024.
(Continued)

*Primary Examiner* — Nguyen Tran
(74) *Attorney, Agent, or Firm* — Li & Cai Intellectual Property (USA) Office

(57) ABSTRACT

A ripple detection device and a ripple suppression device. The ripple detection device includes: a ripple sampling unit, at least two DC sampling units, and a digital signal processing unit; the ripple sampling unit outputs a first voltage signal at an output port of a non-isolated DC/DC bidirectional energy conversion unit to the digital signal processing unit; the DC sampling unit outputs a first DC signal in a second voltage signal at a connected port of the non-isolated DC/DC bidirectional energy conversion unit to the digital signal processing unit and blocks an AC signal in the second voltage signal to be output to the digital signal processing unit; the digital signal processing unit determines a ripple noise signal at the output port of the non-isolated DC/DC (Continued)

bidirectional energy conversion unit according to the first voltage signal and the first DC signal.

16 Claims, 10 Drawing Sheets

(56) References Cited

U.S. PATENT DOCUMENTS

| | | | |
|---|---|---|---|
| 11,515,067 B2* | 11/2022 | Wang | ................. H01F 7/064 |
| 2014/0347896 A1 | 11/2014 | Chung | |
| 2017/0181234 A1 | 6/2017 | Huang | |

FOREIGN PATENT DOCUMENTS

| | | | |
|---|---|---|---|
| JP | 2003338739 A | 11/2003 |
| JP | 2012151926 A | 8/2012 |
| JP | 2015211517 A | 11/2015 |
| JP | 2018085827 A | 5/2018 |

OTHER PUBLICATIONS

Japan Patent Office, JP2022-581646 First Office Action issued on Jan. 23, 2024.

* cited by examiner

RIPPLE DETECTION DEVICE AND RIPPLE SUPPRESSION DEVICE

CROSS-REFERENCE TO RELATED APPLICATION

The present application claims the priority of Chinese Patent Application No. 202010602401.X filed to State Intellectual Property Office of the People's Republic of China on Jun. 28, 2020, the contents of which are incorporated herein by reference as if fully set forth herein.

TECHNICAL FIELD

Embodiments of the present application relates to the field of power electronic technologies.

BACKGROUND

DC/DC (direct-current to direct-current) bidirectional energy converters are converters with two or more energy ports. Taking a two-port bidirectional energy converter as an example, one of the ports is an energy input port, and the other is an energy output port. The energy input port and the energy output port can be interchanged, and energy can be transmitted and flowed in both directions between the input port and the output port.

Due to the simple circuit structure and high conversion efficiency, non-isolated DC/DC bidirectional energy converters have been widely used this year. However, ripple noise signals are often generated at the output port, which may reduce the working performance of the non-isolated DC/DC bidirectional energy converters.

SUMMARY

A first aspect of the embodiments of the present application provides a ripple detection device including: a ripple sampling unit, at least two DC sampling units, and a digital signal processing unit; the ripple sampling unit includes at least two input ports and an output port, an i-th input port of the ripple sampling unit is connected to an i-th port of a non-isolated DC/DC bidirectional energy conversion unit, and the output port of the ripple sampling unit is connected to an input port of the digital signal processing unit; one of the at least two DC sampling units includes one input port and one output port, the input port of the DC sampling unit is connected to a port of the non-isolated DC/DC bidirectional energy conversion unit, and the output port of the DC sampling unit is connected to an input port of the digital signal processing unit, where i is an integer greater than or equal to 1; the ripple sampling unit is configured to output a first voltage signal at an output port of the non-isolated DC/DC bidirectional energy conversion unit to the digital signal processing unit; each of the DC sampling units is configured to output a first DC signal in a second voltage signal at the connected port of the non-isolated DC/DC bidirectional energy conversion unit to the digital signal processing unit; and to block an AC signal in the second voltage signal to be output to the digital signal processing unit; the digital signal processing unit is configured to determine a ripple noise signal at the output port of the non-isolated DC/DC bidirectional energy conversion unit according to the first voltage signal and the first DC signal.

A second aspect of the embodiments of the present application provides a ripple suppression device including the above ripple detection device and a ripple suppression unit; the ripple suppression unit is configured to: calculate a difference between a reference voltage signal and a digital signal corresponding to the ripple noise signal to obtain a first difference signal; calculate a difference between the first difference signal and a digital signal corresponding to the first voltage signal to obtain a second difference signal; calculate a driving signal of each switching device in the non-isolated DC/DC bidirectional energy conversion unit according to the second difference signal, and output the driving signal to a driving unit; or, calculate a difference between the reference voltage signal and a digital signal corresponding to a low-frequency ripple signal to obtain a first difference signal; calculate a difference between the third difference signal and the digital signal corresponding to the first voltage signal to obtain a fourth difference signal; calculate a driving signal of each switching device in the non-isolated DC/DC bidirectional energy conversion unit according to the fourth difference signal, and output the driving signal to the driving unit.

DETAIL DESCRIPTION OF EMBODIMENTS

Figure 1:
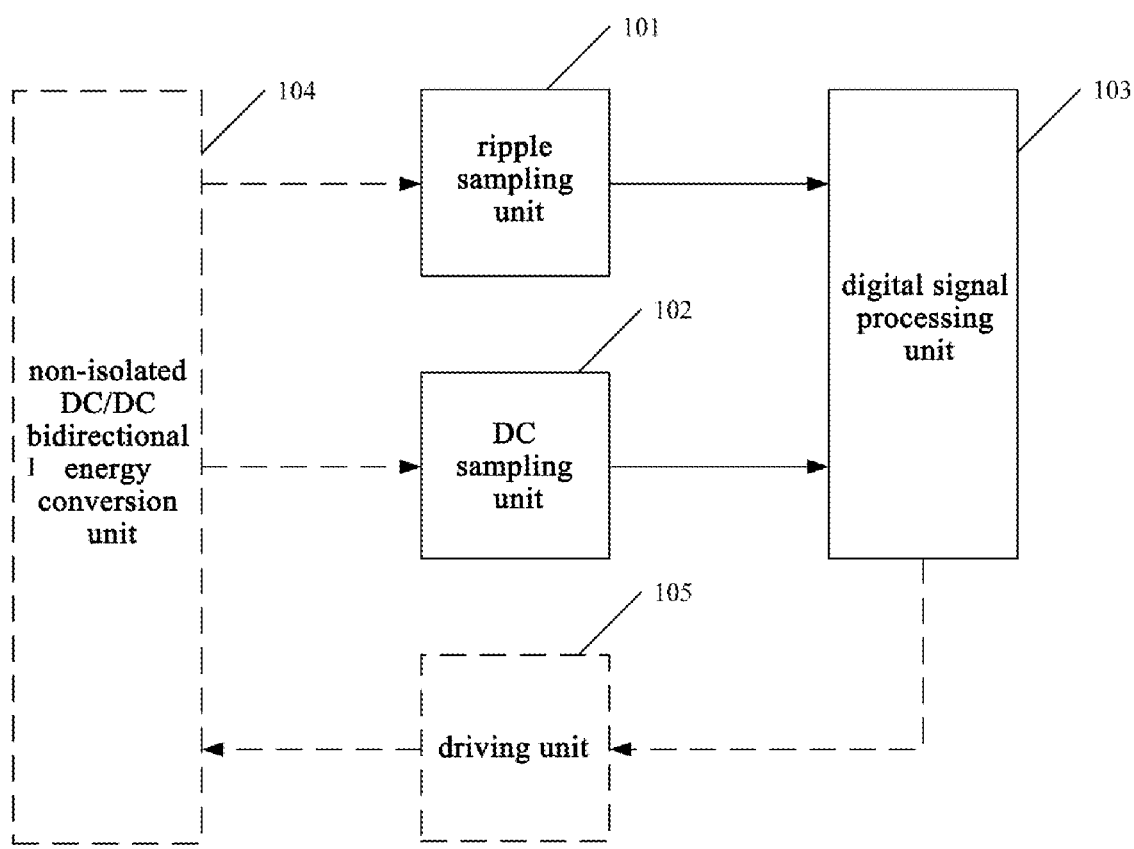
FIG. 1 is a compositional block diagram of a ripple detection device according to an embodiment of the present application.

In order for those skilled in the art to better understand the technical solution of the present application, the ripple detection device and the ripple suppression device provided by the present application will be described in detail below in conjunction with the accompanying drawings.

The following will refer to the accompanying drawings to describe the exemplary embodiments more fully, but the exemplary embodiments may be embodied in different forms and should not be construed as limited to the embodiments described herein. Conversely, the embodiments are provided to make the present application thorough and complete, and to enable those skilled in the art to fully understand the scope of the present application.

In the absence of conflict, the embodiments of the present application and the features in the embodiments may be combined with each other.

As used herein, the term "and/or" includes any and all combinations of at least one relevant enumerated item.

The terminology used herein is only used to describe specific embodiments, and is not intended to limit the present application. As used herein, the singular forms "a" and "the" are also intended to include the plural, unless otherwise clearly indicated in the context. It will also be understood that, when the terms "including" and/or "consist of . . . " are used in this specification, it specifies the presence of said feature, entity, step, operation, element and/or component, but does not exclude the presence or addition of at least one other feature, entity, step, operation, element, component and/or group thereof.

Unless otherwise defined, all terms used herein (including technical and scientific terms) have the same meanings as those generally understood by those of ordinary skill in the art. It will also be understood that, such terms as those defined in commonly used dictionaries should be interpreted to have meanings consistent with their meanings in the context of the relevant art and the present application, and will not be construed as having idealized or overly formal meanings, unless expressly so defined herein.

There are two reasons for the non-isolated DC/DC bidirectional energy converter to generate ripple noise signals at the output port: first, due to the non-isolated structure of the circuit in the non-isolated DC/DC bidirectional energy converter, a low-frequency ripple signal input from an external power supply equipment to the input port is often transmitted to the output port through the circuit, the low-frequency ripple signal is superimposed with the high-frequency noise signal generated by the converter itself, and then a larger ripple noise signal is generated at the output port; second, when the input port and output port are interchanged, the ripple noise signal will also be transferred from the original output port to the original input port.

Since the ripple noise signals can degrade the performance of the non-isolated DC/DC bidirectional energy converter, it is necessary to detect and suppress the ripple noise signals.

It should be noted that the ripple noise signals include a low-frequency ripple signal and a high-frequency noise signal, and the ripple detection circuit in the embodiments of the present application can realize the detection of the low-frequency ripple signal and the high-frequency noise signal, as well as the suppression of the low-frequency ripple signal.

It should be noted that the non-isolated DC/DC bidirectional energy converter (i.e., the non-isolated DC/DC bidirectional energy conversion unit below) includes: two or more energy ports, in which at least one is an input port and one is an output port; negative terminals of the input port and the output port are located on a same network, and energy can flow in both directions between the input port and the output port.

An embodiment of the present application provides a ripple detection device. Referring to FIG. 1, which shows a compositional block diagram of a ripple detection device according to the embodiment of the present application, the ripple detection device includes: a ripple sampling unit 101, at least two DC sampling units 102, and a digital signal processing unit 103.

In an implementation, the ripple sampling unit 101 includes at least two input ports and one output port, an i-th input port of the ripple sampling unit 101 is connected to an i-th port of a non-isolated DC/DC bidirectional energy conversion unit, and the output port of the ripple sampling unit 101 is connected to an input port of the digital signal processing unit 103, where i is an integer greater than or equal to 1.

Figure 2:
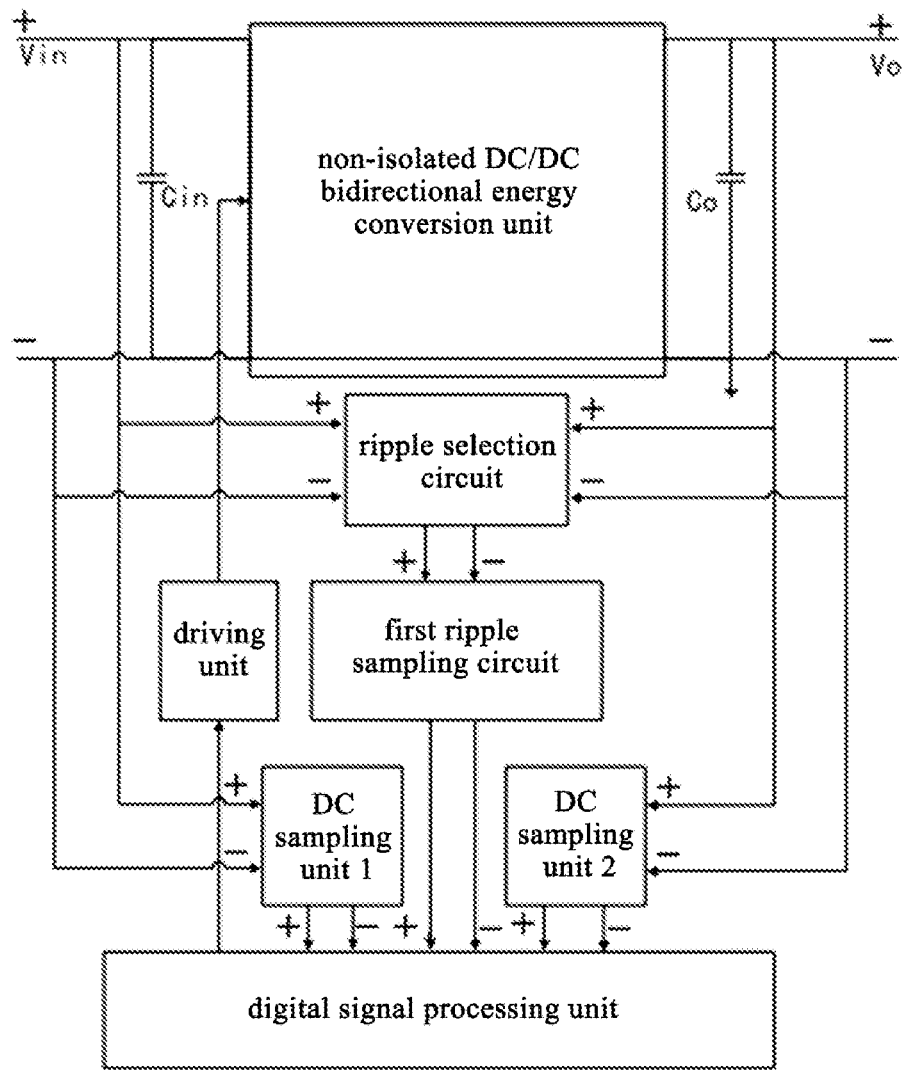
FIG. 2 is another compositional diagram of a ripple detection device according to an embodiment of the present application.

Each DC sampling unit includes one input port and one output port, the input port of the DC sampling unit 102 is connected to a port of the non-isolated DC/DC bidirectional energy conversion unit, and the output port of the DC sampling unit 102 is connected to an input port of the digital signal processing unit 103; the input port of the digital signal processing unit 103 connected to the DC sampling unit 102 is different from the input port of the digital signal processing unit 103 connected to the ripple sampling unit 101; different DC sampling units 102 are connected to different input ports of the digital signal processing unit 103. FIG. 2 shows a schematic diagram by taking a non-isolated DC/DC bidirectional energy conversion unit having two ports as an example. As shown in FIG. 2, there are two DC sampling units 102 (which are a DC sampling unit 1 and a DC sampling unit 2, respectively). A positive terminal of the input port of the DC sampling unit 1 is connected to a positive terminal of an input voltage Vin (i.e., the input port of the non-isolated DC/DC bidirectional energy conversion unit), a negative terminal of the input port of the DC sampling unit 1 is connected to the negative terminal of the input voltage Vin, a positive terminal of the input port of the DC sampling unit 2 is connected to a positive terminal of an output voltage Vo (i.e., the output port of the non-isolated DC/DC bidirectional energy conversion unit), and a negative terminal of the input port of the DC sampling unit 2 is connected to a negative terminal of the output voltage Vo; the output ports of the DC sampling unit 1 and the DC sampling unit 2 are connected to the input port of the digital signal processing unit 103.

The digital signal processing unit 103 includes at least three input ports.

In an implementation, the number of the input ports of the ripple sampling unit 101 is greater than or equal to the number of the ports of the non-isolated DC/DC bidirectional energy conversion unit, and the number of the DC sampling units 102 is equal to the number of the ports of the non-isolated DC/DC bidirectional energy conversion unit.

In an implementation, the ripple sampling unit 101 is configured to output a first voltage signal at an output port of the non-isolated DC/DC bidirectional energy conversion unit to the digital signal processing unit 103.

The DC sampling unit 102 is configured to output a first DC signal in a second voltage signal at the connected port of the non-isolated DC/DC bidirectional energy conversion unit to the digital signal processing unit 103; and to block an AC signal in the second voltage signal to be output to the digital signal processing unit 103.

The digital signal processing unit 103 is configured to determine a ripple noise signal at the output port of the non-isolated DC/DC bidirectional energy conversion unit according to the first voltage signal and the first DC signal.

In an implementation, the digital signal processing unit 103 is specifically configured to determine the ripple noise signal at the output port of the non-isolated DC/DC bidirectional energy conversion unit as a difference between the first voltage signal and the first DC signal.

The ripple detection device provided in the embodiment of the present application uses the ripple sampling unit to realize the acquisition of the first voltage signal at the output port of the non-isolated DC/DC bidirectional energy conversion unit, uses the DC sampling unit to realize the acquisition of the first DC signal in the second voltage signal at the connected port of the non-isolated DC/DC bidirectional energy conversion unit, and uses the digital signal processing unit to realize the processing of the first voltage signal acquired by the ripple sampling unit and the DC signal acquired by the first DC sampling unit so as to obtain the ripple noise signal at the output port of the non-isolated DC/DC bidirectional energy conversion unit, thereby realizing the detection of the ripple noise signal, and thus improving the working performance of the non-isolated DC/DC bidirectional energy conversion unit.

In an implementation, the ripple sampling unit 101 may be implemented in either of the following Mode I or Mode II.

In Mode I, as shown in FIG. 2, since the output port of the non-isolated DC/DC bidirectional energy conversion unit is not fixed, and the ripple detection device only needs to detect the ripple noise signal on the side of the output port, the digital signal processing unit 103 determines which side of the non-isolated DC/DC bidirectional energy conversion unit will be used as the output port, and then control the ripple sampling unit to be connected with the output port and disconnected from the input port. Accordingly, the ripple sampling unit 101 includes: a ripple selection circuit and a first ripple sampling circuit. The ripple selection circuit controls which side will be connected to the first ripple sampling circuit, so that the voltage signal on the connected side is input to the first ripple sampling circuit, so as to realize the acquisition of the first voltage signal at the output port. In this way, the same first ripple sampling circuit is used regardless of which side is the output port, simplifying the circuit configuration and ensuring the consistency of the first ripple sampling circuit and the sampling accuracy.

In Mode II, since the output port of the non-isolated DC/DC bidirectional energy conversion unit is not fixed, and the ripple detection device only needs to detect the ripple noise signal on the side of the output port, it is necessary to provide a second ripple sampling circuit for each port, that is, the ripple sampling unit 101 includes: at least two second ripple sampling circuits. Thereby, the acquisition of the first voltage signal of the output port is realized.

It should be noted that, the schematic diagram shown in FIG. 2 takes a two-port non-isolated DC/DC bidirectional energy conversion unit as an example, and the ripple detection circuit corresponding to a multi-port non-isolated DC/DC bidirectional energy conversion unit can be conceived. The figure is not intended to limit the embodiment of the present application.

The above two Modes will be described in detail below.

(I) The Ripple Sampling Unit 101 Includes: A Ripple Selection Circuit and a First Ripple Sampling Circuit.

As for Mode I, in an implementation, the ripple selection circuit includes at least two input ports and one output port, an i-th input port of the ripple selection circuit is connected to an i-th port of the non-isolated DC/DC bidirectional energy conversion unit, and the output port of the ripple selection circuit is connected to an input port of the first ripple sampling circuit; the first ripple sampling circuit includes one input port and one output port, the output port of the first ripple sampling circuit is connected to an input port of the digital signal processing unit. The schematic diagram shown in FIG. 2 takes a two-port non-isolated DC/DC bidirectional energy conversion unit as an example. As shown in FIG. 2, the ripple selection circuit includes two input ports (a first input port and a second input port, respectively) and one output port. A positive terminal of the first input port of the ripple selection circuit is connected to the positive terminal of the input voltage Vin (i.e., the input port of the non-isolated DC/DC bidirectional energy conversion unit), a negative terminal of the first input port of the ripple selection circuit is connected to the negative terminal of the input voltage Vin, a positive terminal of the second input port of the ripple selection circuit is connected to the positive terminal of the output voltage Vo (i.e., the output port of the non-isolated DC/DC bidirectional energy conversion unit), and a negative terminal of the second input port of the ripple selection circuit is connected to the negative terminal of the output voltage Vo; the output port of the ripple selection circuit is connected to the input port of the first ripple sampling circuit.

As for Mode I, in an implementation, the number of the input ports of the ripple selection circuit is greater than or equal to the number of the ports of the non-isolated DC/DC bidirectional energy conversion unit.

As for Mode I, in an implementation, the number of the ripple selection circuit is configured to output the first voltage signal to the first ripple sampling circuit under the control of the digital signal processing unit. Accordingly, the first ripple sampling circuit is configured to output the first voltage signal to the digital signal processing unit. Accordingly, the digital signal processing unit is further configured to control the ripple selection circuit to output the first voltage signal to the first ripple sampling circuit.

As for Mode I, in an implementation, the digital signal processing unit may determine which port of the non-isolated DC/DC bidirectional energy conversion unit is the output port according to a dispatching signal received from a dispatching system, and the dispatching signal is used to indicate which port of the non-isolated DC/DC bidirectional energy conversion unit is the output port.

It should be noted that, in general, one port of the non-isolated DC/DC bidirectional energy conversion unit is connected in parallel with a power supply and a load, and the power supply and the load are also connected in parallel; the other port of the non-isolated DC/DC bidirectional energy conversion unit is connected in parallel with a battery, and if the dispatching system detects that the battery is in a fully charged state and the voltage of the battery is higher than the voltage of the load, it determines that the port in parallel with the load and the power supply is the output port; if the dispatching system detects that the voltage of the load is higher than the voltage of the battery, it determines that the port connected to the battery is the output port; after determining the output port, the dispatching system sends a dispatching signal to the digital signal processing unit.

As for Mode I, in an implementation, the ripple selection circuit may be implemented in either of the following Mode 1 or Mode 2.

Figure 3:
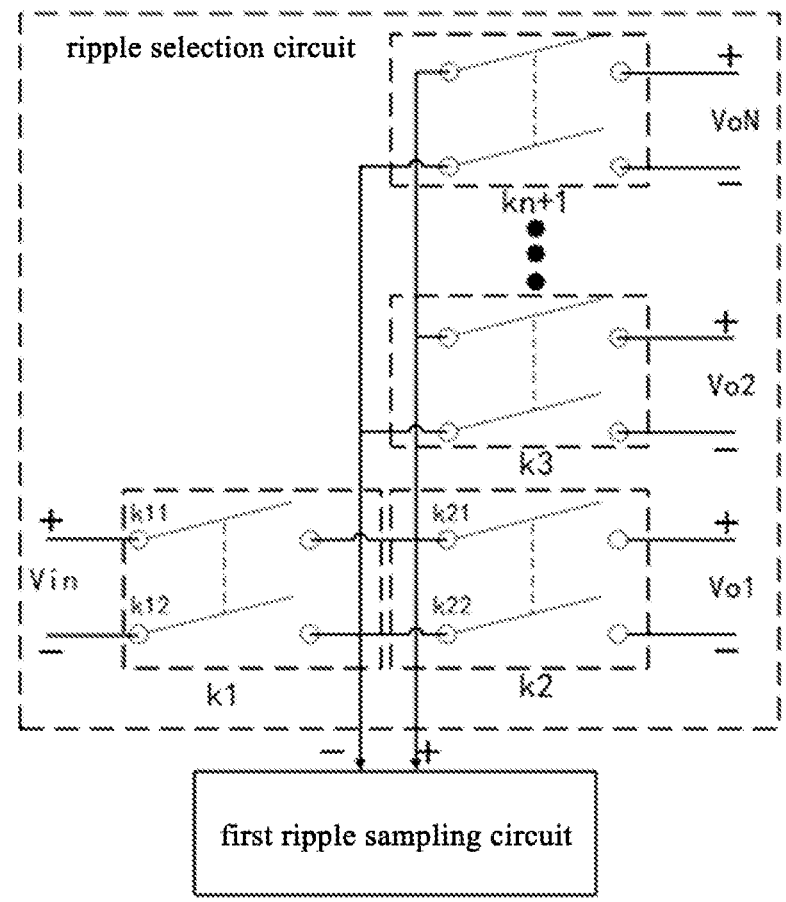
FIG. 3 is a compositional diagram of a ripple selection circuit according to an embodiment of the present application.
Figure 4:
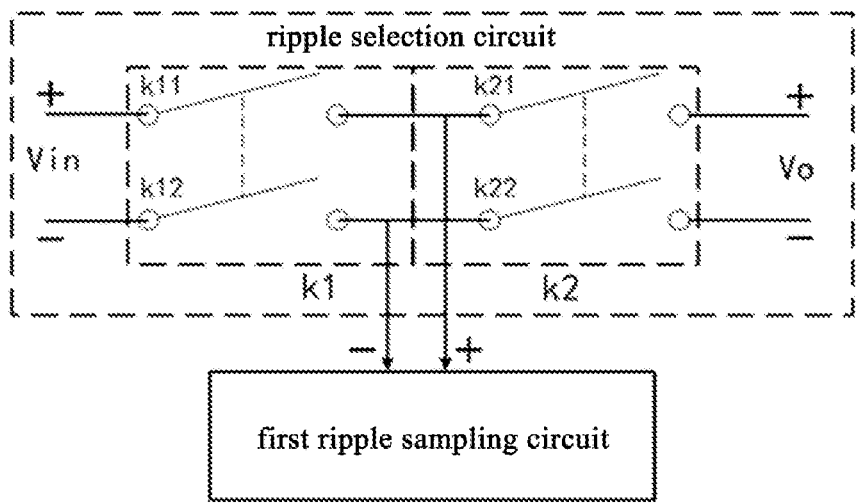
FIG. 4 is another compositional diagram of a ripple selection circuit according to an embodiment of the present application.

In Mode 1, as shown in FIGS. 3 and 4, the ripple selection circuit includes at least two control switch groups, and each of the control switch groups includes two sub-switches; one of the sub-switches in a j-th control switch group is connected in series in a loop between a positive terminal of a j-th port of the non-isolated DC/DC bidirectional energy conversion unit and a positive terminal of the input port of the first ripple sampling circuit, and the other sub-switch in the j-th control switch group is connected in series in a loop between a negative terminal of the j-th port of the non-isolated DC/DC bidirectional energy conversion unit and a negative terminal of the input port of the first ripple sampling circuit, where j is an integer greater than or equal to 1.

It should be noted that, as for Mode 1, N control switch groups are switched on in a complementary manner; N is the number of control switch groups included in the ripple selection circuit. In other words, one of the N control switch groups is switched on while the rest of the control switch groups are switched off.

It should be noted that, a control switch group is switched on means that both the two sub-switches included in this control switch group are on, and a control switch group is switched off means that both the two sub-switches included in this control switch group are off.

Figure 5:
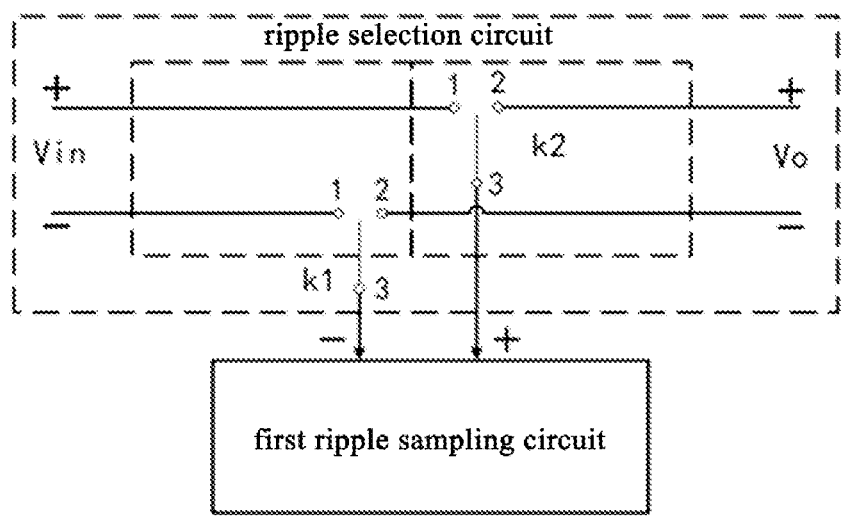
FIG. 5 is another compositional diagram of a ripple selection circuit according to an embodiment of the present application.

In Mode 2, as shown in FIG. 5, as for the two-port non-isolated DC/DC bidirectional energy conversion unit, the ripple selection circuit may be implemented by using two single-pole double-throw selection switches (such as the single-pole double-throw selection switch K1 and the single-pole double-throw selection switch K2 in FIG. 5). The single-pole double-throw selection switch includes: a first contact (such as the contact 1 in FIG. 5), a second contact (such as the contact 2 in FIG. 5), a third contact (such as the contact 3 in FIG. 5), and a switching tab. One end of the switching tab is connected to the third contact, and another end of the switching tab is switched between the first contact and the second contact. The first contact (such as the contact 1 in FIG. 5) of one of the single-pole double-throw selection switches is connected to the negative terminal of one of the ports of the non-isolated DC/DC bidirectional energy conversion unit, the second contact (such as the contact 2 in FIG. 5) of the one of the single-pole double-throw selection switches is connected to the negative terminal of the other port of the non-isolated DC/DC bidirectional energy conversion unit, and the third contact (such as the contact 3 in FIG. 5) of the one of the single-pole double-throw selection switches is connected to the negative terminal of the input port of the first ripple sampling circuit; the first contact (such as the contact 1 in FIG. 5) of the other single-pole double-throw selection switch is connected to the positive terminal of one of the ports of the non-isolated DC/DC bidirectional energy conversion unit, the second contact (such as the contact 2 in FIG. 5) of the other single-pole double-throw selection switch is connected to the positive terminal of the other port of the non-isolated DC/DC bidirectional energy conversion unit, and the third contact (such as the contact 3 in FIG. 5) of the other single-pole double-throw selection switch is connected to the positive terminal of the input port of the first ripple sampling circuit.

It should be noted that, when the switching tabs of both the two single-pole double-throw switches are switched to the first contact, the input port of the ripple selection circuit is connected to one of the ports of the non-isolated DC/DC bidirectional energy conversion unit; when the switching tabs of both the two single-pole double-throw switches are switched to the second contact, the input port of the ripple selection circuit is connected to the other port of the non-isolated DC/DC bidirectional energy conversion unit.

As for Mode I, in an implementation, the ripple sampling circuit and the DC sampling unit 102 may be implemented in either of the following Mode 11 and Mode 12.

In Mode 11, the first voltage signal output by the first ripple sampling circuit and the first DC signal output by the DC sampling unit 102 are both outside the signal reception range of the digital signal processing unit 103, and thus, in order to make the signals input to the digital signal processing unit 103 within the signal reception range of the digital processing unit 103, the first voltage signal needs to be amplified and DC biased in the first ripple sampling circuit, and the first DC signal in the second voltage signal needs to be amplified and DC biased in the DC sampling unit 102.

The first ripple sampling circuit may be specifically configured to: amplify and DC bias the first voltage signal to obtain a third voltage signal, and output the third voltage signal to the digital signal processing unit 103. Accordingly, the DC sampling unit 102 is specifically configured to: amplify and DC bias the first DC signal in the second voltage signal to obtain a second DC signal, and output the second DC signal to the digital signal processing unit 103; and to block the AC signal in the second voltage signal to be output to the digital signal processing unit 103. Accordingly, the digital signal processing unit 103 is configured to determine a ripple noise signal at the output port of the non-isolated DC/DC bidirectional energy conversion unit according to the third voltage signal and the second DC signal.

It should be noted that the amplification factor of the first ripple sampling circuit and the DC sampling unit 102 may or may not be equal.

As for Mode 11, in an implementation, the first ripple sampling circuit is specifically configured to amplify the first voltage signal by: amplifying the DC signal in the first voltage signal; and not amplifying the AC signal in the first voltage signal. In this case, the digital signal processing unit 103 is specifically configured to: determine the ripple noise signal at the output port of the non-isolated DC/DC bidirectional energy conversion unit is a difference between the third voltage signal and the second DC signal.

As for Mode 11, in another implementation, the first ripple sampling circuit is specifically configured to amplify the first voltage signal by: amplifying the DC signal and AC signal in the first voltage signal. In this case, the digital signal processing unit 103 is specifically configured to: determine the ripple noise signal at the output port of the non-isolated DC/DC bidirectional energy conversion unit as a ratio of a difference between the third voltage signal and the second DC signal and the amplification factor.

As for Mode 11, in an implementation, the first ripple sampling circuit includes: a first differential proportional amplification circuit and a first DC bias circuit.

In an implementation, the first differential proportional amplification circuit includes: a first DC differential amplification circuit and a first AC differential amplification circuit;

In an implementation, the first differential proportional amplification circuit and the first DC bias circuit are the same as the first differential proportional amplification circuit and the first DC bias circuit in the following Mode 12, and may also be implemented by other circuits, and the specific circuit implementations are not intended to limit the embodiment of the present application, which will not be repeated herein.

As for Mode 11, in an implementation, the DC sampling unit includes: a second differential proportional amplification circuit and a second DC bias circuit.

In an implementation, the second differential proportional amplification circuit includes: a second DC differential amplification circuit and a second AC differential amplification circuit.

In an implementation, the second differential proportional amplification circuit and the second DC bias circuit are the same as the second differential proportional amplification circuit and the second DC bias circuit in the following Mode 12, and may also be implemented by other circuits, and the specific circuit implementations are not intended to limit the embodiment of the present application, which will not be repeated herein.

Figure 6:
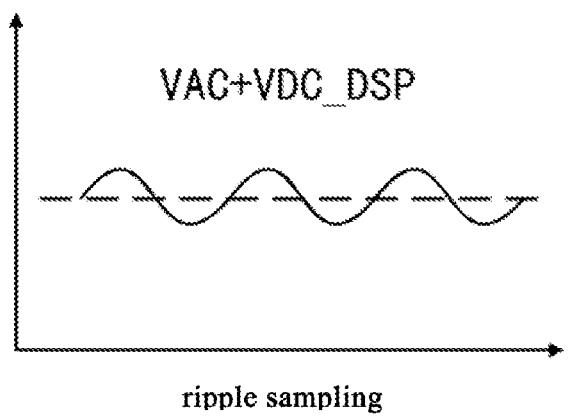
FIG. 6 is a schematic diagram of a low-pass filtered first voltage signal output by a first ripple sampling circuit according to an embodiment of the present application.

In Mode 12, the above ripple noise signal is a superimposed signal of a low-frequency ripple signal and a high-frequency noise signal. For the purpose of obtaining a low-frequency ripple signal, since the first voltage signal output by the first ripple sampling circuit and the DC signal output by the DC sampling unit 102 are both outside the signal reception range of the digital signal processing unit 103, the first voltage signal needs to be amplified, DC biased and low-pass filtered in the first ripple sampling circuit, and the DC signal in the second voltage signal needs to be amplified, DC biased and low-pass filtered in the DC sampling unit 102, in order to make the signal input to the digital signal processing unit 103 within the reception range of the digital processing unit 103. That is, the first ripple sampling circuit is specifically configured to: amplify and DC bias the first voltage signal to obtain a third voltage signal, perform low-pass filtering on the third voltage signal to obtain a fourth voltage signal, and output the fourth voltage signal (as shown in FIG. 6) to the digital signal processing unit 103.

Figure 7:
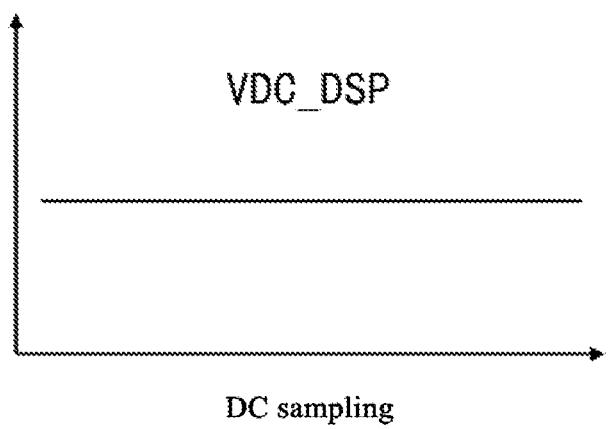
FIG. 7 is a schematic diagram of a low-pass filtered DC signal output by a DC sampling circuit according to an embodiment of the present application.

The DC sampling unit 102 is specifically configured to: amplify and DC bias the first DC signal in the second voltage signal to obtain a second DC signal, perform low-pass filtering on the second DC signal to obtain a third DC signal, and output the third DC signal (as shown in FIG. 7) to the digital signal processing unit 103; and to block the AC signal in the second voltage signal to be output to the digital signal processing unit 103.

Figure 8:
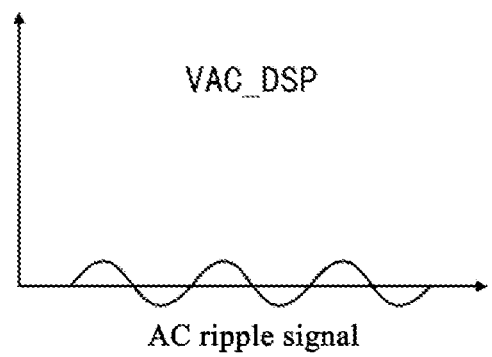
FIG. 8 is a schematic diagram of a low-frequency ripple signal according to an embodiment of the present application.

As for Mode 12, in an implementation, the ripple sampling circuit 101 is specifically configured to amplify the first voltage signal by: amplifying the DC signal in the first voltage signal; and not amplifying the AC signal in the first voltage signal. In this case, the digital signal processing unit 103 is specifically configured to: determine the low-frequency ripple signal (as shown in FIG. 8) at the output port of the non-isolated DC/DC bidirectional energy conversion unit is a difference between the fourth voltage signal and the third DC signal.

As for Mode 12, in another implementation, the ripple sampling circuit 101 is specifically configured to amplify the first voltage signal by: amplifying the DC signal and the AC signal in the first voltage signal. In this case, the digital signal processing unit 103 is specifically configured to: determine the ripple noise signal at the output port of the non-isolated DC/DC bidirectional energy conversion unit is a ratio of a difference between the fourth voltage signal and the third DC signal and the amplification factor.

Figure 9:
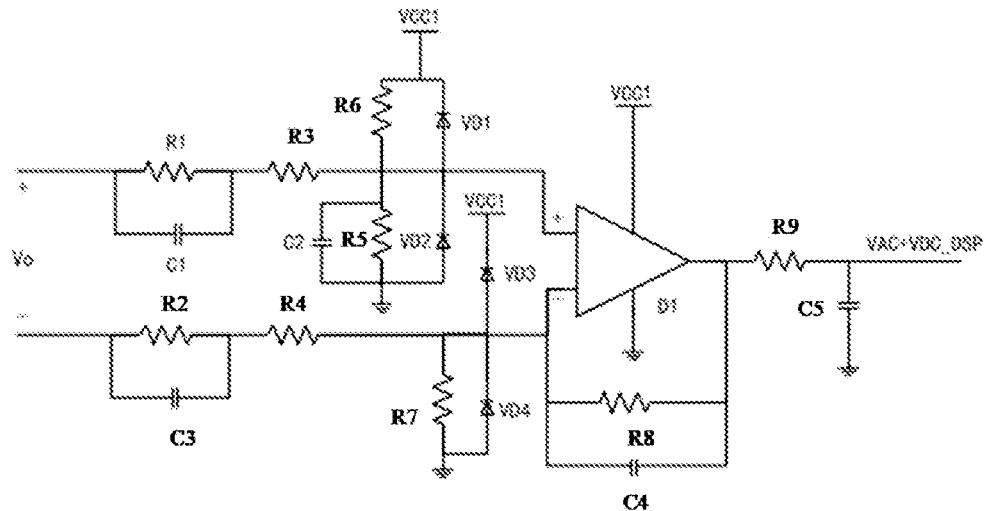
FIG. 9 is a schematic diagram of a voltage signal output by a ripple sampling circuit according to an embodiment of the present application.

As for Mode 12, in an implementation, as shown in FIG. 9, the ripple sampling circuit 101 includes: a first differential proportional amplification circuit, a first DC bias circuit and a first low-pass filter circuit.

In an implementation, the first differential proportional amplification circuit includes: a first DC differential amplification circuit and a first AC differential amplification circuit.

In an implementation, the first DC differential amplification circuit includes: a first resistor R1, a second resistor R2, a third resistor R3, a fourth resistor R4, a fifth resistor R5, a sixth resistor R6, an eighth resistor R8 and a first operational amplifier D1; one end of the first resistor R1 is connected to a positive terminal of the output port of the ripple selection circuit, another end of the first resistor R1 is connected to one end of the third resistor R3, and another end of the third resistor R3 is connected to a positive terminal of an input port of the first operational amplifier D1; one end of the second resistor R2 is connected to a negative terminal of the output port of the ripple selection circuit, another end of the second resistor R2 is connected to one end of the fourth resistor R4, and another end of the fourth resistor R4 is connected to a negative terminal of the input port of the first operational amplifier; a power supply terminal of the first operational amplifier D1 is connected to a first power supply VCC1, and a ground terminal of the first operational amplifier D1 is grounded; one end of the fifth resistor R5 is grounded, another end of the fifth resistor R5 is connected to one end of the sixth resistor R6 and the positive terminal of the input port of the first operational amplifier D1, and another end of the sixth resistor R6 is connected to the first power supply VCC1; one end of the eighth resistor R8 is connected to the negative terminal of the input port of the first operational amplifier D1, and another end of the eighth resistor R8 is connected to an output port of the first operational amplifier D1.

In an implementation, the first AC differential amplification circuit includes: a first capacitor C1, a second capacitor C2, a third capacitor C3, a fourth capacitor C4, the third resistor R3, the fourth resistor R4, the fifth resistor R5, the eighth resistor R8 and the first operational amplifier D1; the first capacitor C1 is connected in parallel with the first resistor R1, the second capacitor C2 is connected in parallel with the fifth resistor R5, the third capacitor C3 is connected in parallel with the second resistor R2, and the fourth capacitor C4 is connected in parallel with the eighth resistor R8.

In an implementation, the first DC bias circuit includes: the fifth resistor R5, the sixth resistor R6, and the first power supply VCC1.

In an implementation, the first low-pass filter circuit includes: a seventh resistor R7, a ninth resistor R9 and a fifth capacitor C5; one end of the seventh resistor R7 is connected to the negative terminal of the input port of the first operational amplifier D1, another end of the seventh resistor R7 is grounded, one end of the ninth resistor R9 is connected to the output port of the first operational amplifier D1, another end of the ninth resistor R9 is simultaneously connected to one end of the fifth capacitor C5 and the output port of the first ripple sampling circuit, and another end of the fifth capacitor is grounded C5. The first low-pass filtering circuit is configured to filter out the high-frequency signal from the third voltage signal, while retaining the low-frequency signal (including DC signal and low-frequency ripple signal).

In an implementation, R1=R2, R3=R4, R5=R8, R7=R9.

In an implementation, C1=C3, C2=C4.

The first capacitor C1, the second capacitor C2, the third capacitor C3, and the fourth capacitor C4 in the first ripple sampling circuit provide an AC path for the AC signal in the first voltage signal at the output port of the non-isolated DC/DC bidirectional energy conversion unit, and the AC signal will be directly transmitted to the output port of the first ripple sampling circuit. If R3=R4=R5=R8, the amplification factor for the AC signal is 1, and the low-pass filtered first voltage signal output from the output port of the first ripple sampling circuit should be a superposition of the proportionally amplified DC signal and the original AC signal; If R3 #R5, the amplification factor for the AC signal is not 1, and the low-pass filtered first voltage signal output from the output port of the first ripple sampling circuit should be a superposition of the proportionally amplified DC signal and the proportionally amplified AC signal.

As for Mode 12, in an implementation, as shown in FIG. 9, the low-pass filtered R5 R5 R5 first voltage signal is:

$$VAC + \text{VDC\_DSP} = V_{O\_DC} \times \frac{R5}{R1+R3} + \frac{R5}{R6}VCC1 + \frac{R5}{R3}V_{O\_AC};$$

where $$\frac{R5}{R6}VCC1$$

is the DC bias voltage, VAC is the AC signal in the low-pass filtered first voltage signal, VDC_DSP is the DC signal in the low-pass filtered first voltage signal, $V_{O\_DC}$ is the DC signal in the first voltage signal at the output port of the non-isolated DC/DC bidirectional energy conversion unit, $V_{O\_AC}$ is the AC signal in the first voltage signal at the output port of the non-isolated DC/DC bidirectional energy conversion unit, and VCC1 is the first power supply.

As for Mode 12, in an implementation, the first ripple sampling circuit further includes a first clamp protection circuit.

In an implementation, the first clamp protection circuit includes: a first diode VD1, a second diode VD2, a third diode VD3, a fourth diode VD4; a cathode of the first diode VD1 is connected to the first power supply VCC1, an anode of the first diode VD1 is connected to a cathode of the second diode VD2 and the positive terminal of the input port of the first operational amplifier D1, an anode of the second diode VD2 is grounded, a cathode of the third diode VD3 is connected to the first power supply VCC1, an anode of the third diode VD3 is connected to a cathode of the fourth diode VD4 and the negative terminal of the input port of the first operational amplifier D1, and an anode of the fourth diode VD4 is grounded; the first clamp protection circuit limits the input voltage of the first operational amplifier D1 to 0 to 3.3V, which provides a protection.

Figure 10:
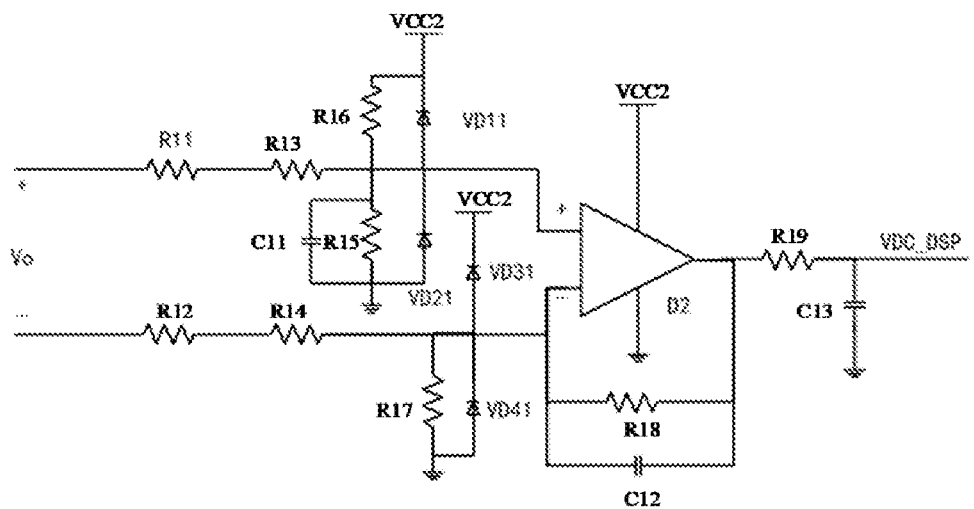
FIG. 10 is a schematic diagram of a voltage signal output by a DC sampling unit according to an embodiment of the present application.

As for Mode 12, in an implementation, as shown in FIG. 10, the DC sampling unit 102 includes: a second differential proportional amplification circuit, a second DC bias circuit and a second low-pass filter circuit.

In an implementation, the second differential proportional amplification circuit includes a second DC differential amplification circuit.

In an implementation, the second DC differential amplification circuit includes: a tenth resistor R11, an eleventh resistor R12, a twelfth resistor R13, a thirteenth resistor R14, a fourteenth resistor R15, a fifteenth resistor R16, a seventeenth resistor R18 and a second operational amplifier D2; one end of the tenth resistor R11 is connected to the positive terminal of the output port of the ripple selection circuit, another end of the tenth resistor R11 is connected to one end of the twelfth resistor R13, and another end of the twelfth resistor R13 is connected to a positive terminal of an input port of the second operational amplifier D2; one end of the eleventh resistor R12 is connected to the negative terminal of the output port of the ripple selection circuit, another end of the eleventh resistor R12 is connected to one end of the thirteenth resistor R14, and another end of the thirteenth resistor R14 is connected to a negative terminal of the input port of the second operational amplifier D2; a power supply terminal of the second operational amplifier D2 is connected to a second power supply VCC2, and a ground terminal of the second operational amplifier D2 is grounded; one end of the fourteenth resistor R15 is grounded, another end of the fourteenth resistor R15 is connected to one end of the fifteenth resistor R16 and the positive terminal of the input port of the second operational amplifier D2, and another end of the fifteenth resistor R16 is connected to the second power supply VCC2; one end of the seventeenth resistor R18 is connected to the negative terminal of the input port of the second operational amplifier D2, and another end of the seventeenth resistor R18 is connected to an output port of the second operational amplifier D2.

In an implementation, the second DC bias circuit includes: the fourteenth resistor R15, the fifteenth resistor R16, and the second power supply VCC.

In an implementation, the second low-pass filter circuit includes: a sixteenth resistor R17, an eighteenth resistor R19 and an eighth capacitor C13; one end of the sixteenth resistor R17 is connected to the negative terminal of the input port of the second amplifier D2, another end of the sixteenth resistor R17 is grounded, one end of the eighteenth resistor R19 is connected to the output port of the second operational amplifier D2, another end of the eighteenth resistor R19 is connected simultaneously with one end of the eighth capacitor C13 and the output port of the first ripple sampling circuit, and another end of the eighth capacitor C13 is grounded. The second low-pass filtering circuit is configured to filter out the high-frequency signal from the second DC signal, retaining the low-frequency signal (including DC signal).

In an implementation, R11=R12, R13=R14, R15=R18, R17=R19.

In an implementation, C11=C12.

In an implementation, the DC sampling unit 102 may not provide an AC path for the AC signal in the second voltage signal at the port of the non-isolated DC/DC bidirectional energy conversion unit, and the AC signal will not be transmitted to the output port of the first ripple sampling circuit, thus, the DC sampling unit 102 only outputs a low-pass filtered DC signal.

As for Mode 12, in an implementation, as shown in FIG. 10, the low-pass filtered DC signal is:

$$\text{VDC\_DSP} = V_{O\_DC} \times \frac{R15}{R11+R13} + \frac{R15}{R16}VCC2;$$

where $$\frac{R15}{R16}VCC2$$

is the DC bias voltage, VDC_DSP is the third DC signal, $V_{O\_DC}$ is the DC signal in the first voltage signal at the output port of the non-isolated DC/DC bidirectional energy conversion unit, and VCC2 is the second power supply.

As for Mode 12, in an implementation, the DC sampling unit 102 further includes: a fifth diode VD11, a sixth diode VD21, a seventh diode VD31, and an eighth diode VD41; a cathode of the fifth diode VD11 is connected to the second power supply VCC2, an anode of the fifth diode VD11 is connected to a cathode of the sixth diode VD21 and the positive terminal of the input port of the second operational amplifier D2, an anode of the sixth diode VD21 is grounded, a cathode of the seventh diode VD31 is connected to the second power supply VCC2, an anode of the seventh diode VD31 is connected to a cathode of the eighth VD41 and the negative terminal of the input port of the second operational amplifier D2, and an anode of the eighth diode VD41 is grounded; the second clamp protection circuit limits the input voltage of the second operational amplifier D2 to 0 to 3.3V, which provides a protection.

(II) The Ripple Sampling Unit 101 Includes at Least Two Second Ripple Sampling Circuits.

As for Mode II, in an implementation, the number of the second ripple sampling circuits is equal to the number of the ports of the non-isolated DC/DC bidirectional energy conversion unit.

As for Mode II, in an implementation, the second ripple sampling circuit includes one input port and one output port, the input port of the second ripple sampling circuit is connected to a port of the non-isolated DC/DC bidirectional energy conversion unit, and the output port of the second ripple sampling circuit is connected to an input port of the digital signal processing unit.

As for Mode II, in an implementation, the input ports of different second ripple sampling circuits are connected to different input ports of the non-isolated DC/DC bidirectional energy conversion unit, and the output ports of different second ripple sampling circuits are connected to different input ports of the digital signal processing unit.

As for Mode II, in an implementation, the second ripple sampling circuit is configured to output the fifth voltage signal of the connected port of the non-isolated DC/DC bidirectional energy conversion unit to the digital signal processing unit. The digital signal processing unit 103 is further configured to: select one of the fifth voltage signals output by all the second ripple sampling circuits, as the first voltage signal.

As for Mode II, in an implementation, the digital signal processing unit 103 selecting one of the fifth voltage signals output by all the second ripple sampling circuits as the first voltage signal refers to: selecting a fifth voltage signal that is input to the digital signal processing unit 103 by the second ripple sampling circuit connected to the output port of the non-isolated DC/DC bidirectional energy conversion unit, this fifth voltage signal serving as the first voltage signal.

In an implementation, the second ripple sampling circuit may be implemented by using the same circuit as the first ripple sampling circuit, or may be implemented by other circuits, and the specific circuit implementation is not intended to limit the embodiments of the present application.

In an implementation, the digital signal processing unit 103 may be implemented by using a digital signal processing (DSP) chip, for example, chips of TMS320F28xx series available from Texas Instrument (TI), Inc.

In an implementation, the ripple detection device further includes a non-isolated DC/DC bidirectional energy conversion unit 104, which is configured to convert voltage signals at the input port and output port.

In an implementation, the non-isolated DC/DC bidirectional energy conversion unit 104 may be implemented in any one of the following Mode 21 to Mode 24.

Figure 11:
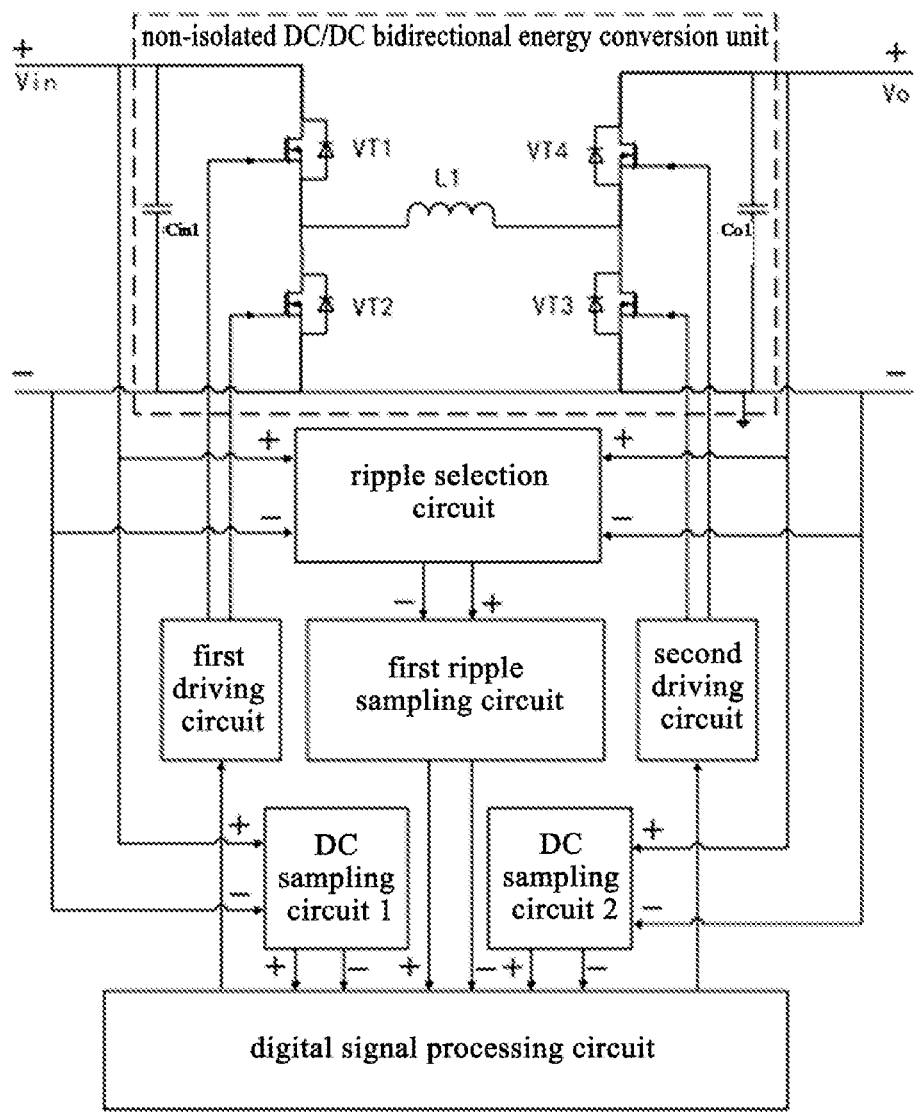
FIG. 11 is a compositional diagram of a non-isolated DC/DC bidirectional energy conversion unit according to an embodiment of the present application.

In Mode 21, as shown in FIG. 11, the non-isolated DC/DC bidirectional energy conversion unit 104 is implemented by using an H-bridge circuit including: a first switching device VT1, a second switching device VT2, a third switching device VT3, a fourth switching device VT4, a first inductor L1, a ninth capacitor Cin1, and a tenth capacitor Co1. A drain of the first switching device VT1 is connected to the positive terminal of one of the ports, a source of the first switching device VT1 is simultaneously connected to one end of the first inductor L1 and a drain of the second switching device VT2, and a gate of the first switching device VT1 is connected to one of the output ports of the first driving circuit. A source of the second switching device VT2 is connected to the negative terminal of one of the ports, and a gate of the second switching device VT2 is connected to the other output port of the first driving circuit. The ninth capacitor Cin1 is connected in parallel between the positive and negative terminals of one of the ports, and a second end of the first inductor L1 is simultaneously connected to a drain of the third switching device VT3 and a source of the fourth switching device VT4. A source of the third switching device VT3 is connected to a negative terminal of the other port, and a gate of the third switching device VT3 is connected to one of the output ports of the second driving circuit. A drain of the fourth switch device VT4 is connected to the positive terminal of the other port, and a gate of the fourth switch device VT4 is connected to the other output port of the second driving circuit. The tenth capacitor Co1 is connected in parallel between the positive and negative terminals of the other port, the negative terminals of the two ports are grounded, and the negative terminal of one port and the negative terminal of the other port are located on a same network.

Figure 12:
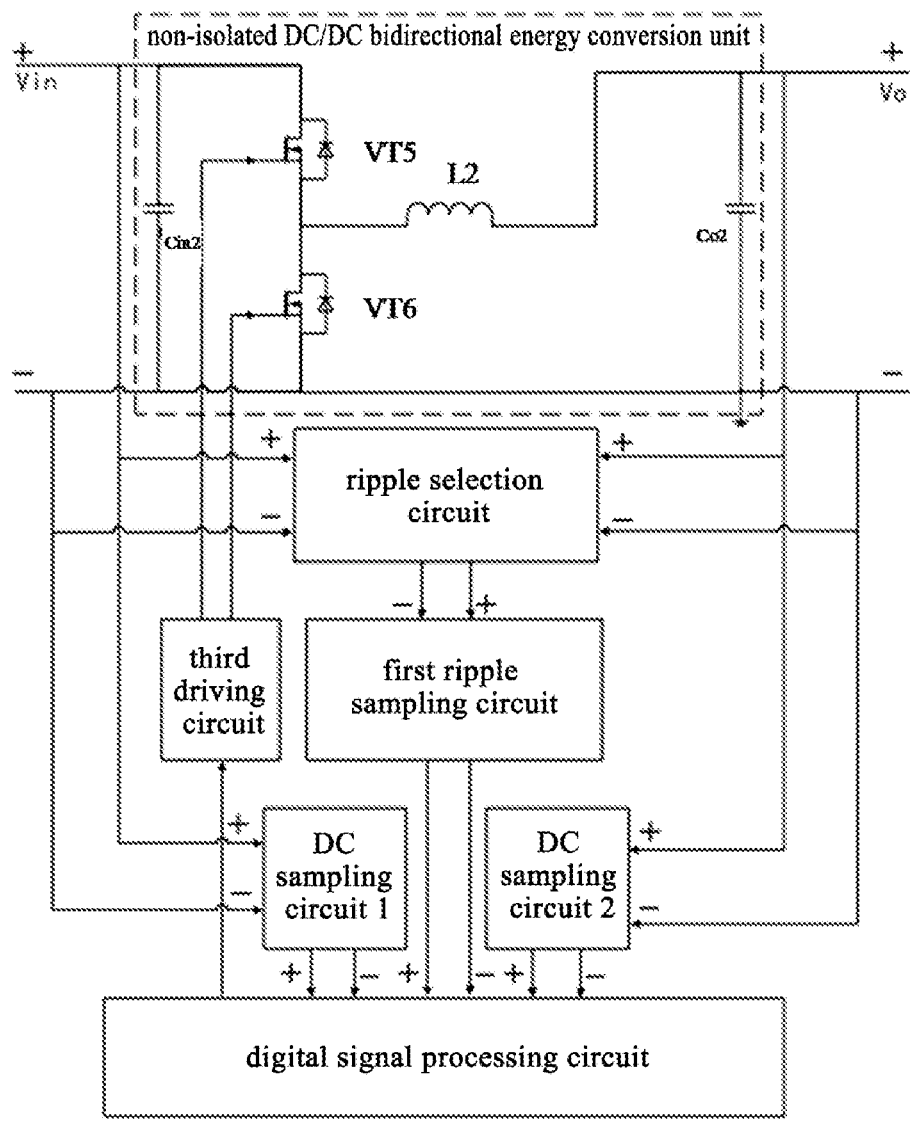
FIG. 12 is another compositional diagram of a non-isolated DC/DC bidirectional energy conversion unit according to an embodiment of the present application.

In Mode 22, as shown in FIG. 12, the non-isolated DC/DC bidirectional energy conversion unit 104 includes: a fifth switching device VT5, a sixth switching device VT6, a second inductor L2, an eleventh capacitor Cin2, a twelfth capacitor Co2. A drain of the fifth switching device VT5 is connected to the positive terminal of one of the ports, a source of the fifth switching device VT5 is simultaneously connected to one end of the second inductor L2 and a drain of the sixth switching device VT6, and a gate of the fifth switching device VT5 is connected to one of the output ports of the third drive circuit. A source of the sixth switch device VT6 is connected to the negative terminal of one of the ports, and a gate of the sixth switch device VT6 is connected to the other output port of the third drive circuit. The eleventh capacitor Cin2 is connected in parallel between the positive and negative terminals of one of the ports, the other end of the second inductor L2 is simultaneously connected to the positive terminal of the other port, the twelfth capacitor Co2 is connected in parallel between the positive and negative terminals of the other port, and the negative terminals of the two ports are grounded. The negative terminal of one port and the negative terminal of the other port are located on a same network.

Figure 13:
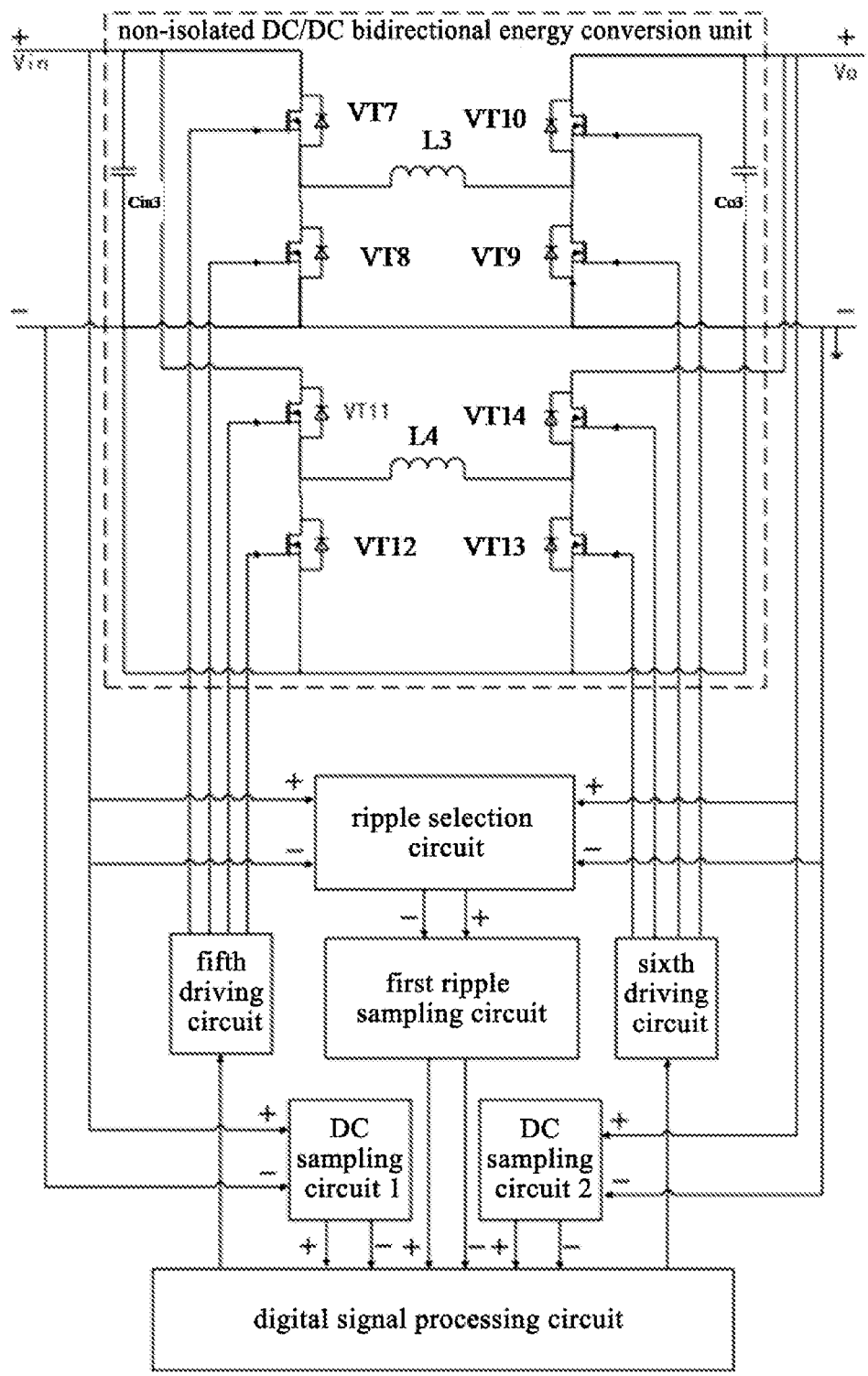
FIG. 13 is another compositional diagram of a non-isolated DC/DC bidirectional energy conversion unit according to an embodiment of the present application.

In Mode 23, as shown in FIG. 13, the non-isolated DC/DC bidirectional energy conversion unit 104 is implemented by using two H-bridge circuits, and the first H-bridge circuit includes: a seventh switching device VT7, an eighth switching device VT8, a ninth switching device VT9, a tenth switching device VT10, a third inductor L3, a thirteenth capacitor Cin3, a fourteenth capacitor Co3. A drain of the seventh switch device VT7 is connected to the positive terminal of one of the ports, a source of the seventh switch device VT7 is simultaneously connected to one end of the third inductor L3 and a drain of the eighth switch device VT8, and a gate of the seventh switch device VT7 is connected to the first output port of the fifth drive circuit. A source of the eighth switch device VT8 is connected to the negative terminal of one of the ports, and a gate of the eighth switch device VT8 is connected to the second output port of the fifth drive circuit. The thirteenth capacitor Cin3 is connected in parallel between the positive and negative terminals of one of the ports, and a second end of the third inductor L3 is simultaneously connected to a drain of the ninth switch device VT9 and a source of the tenth switch device VT10. A source of the ninth switch device VT9 is connected to the negative terminal of the other port, and a gate of the ninth switch device VT9 is connected to the first output port of the sixth drive circuit. A drain of the tenth switch device VT10 is connected to the positive terminal of the other port, and a gate of the tenth switch device VT10 is connected to the second output port of the sixth drive circuit. The fourteenth capacitor Co3 is connected in parallel between the positive and negative terminals of the other port, the negative terminals of the two ports are grounded, and the negative terminal of the one port and the negative terminal of the other port are located on the same network.

The second H-bridge circuit includes: the eleventh switch device VT11, the twelfth switch device VT12, the thirteenth switch device VT13, the fourteenth switch device VT14, and the fourth inductor L4. A drain of the eleventh switching device VT11 is connected to the positive terminal of one of the ports, a source of the eleventh switching device VT11 is simultaneously connected to one end of the fourth inductor L4 and a drain of the twelfth switching device VT12, and a gate of the eleventh switching device VT11 is connected to the third output port of the fifth drive circuit. A source of the twelfth switch device VT12 is connected to the negative terminal of one of the ports, and a gate of the twelfth switch device VT12 is connected to the fourth output port of the fifth drive circuit. The other end of the fourth inductor L4 is simultaneously connected to a drain of the thirteenth switch device VT13 and a source of the fourteenth switch device VT14. A source of the thirteenth switch device VT13 is connected to the negative terminal of the other port, and a gate of the thirteenth switch device VT13 is connected to the third output port of the sixth drive circuit. A drain of the fourteenth switch device VT14 is connected to the positive terminal of the other port, and a gate of the fourteenth switch device VT14 is connected to the fourth output port of the sixth drive circuit. The negative terminal of one of the ports and the negative terminal of the other port are located on the same network.

The two H-bridge circuits work in parallel, where the first H-bridge circuit and the second H-bridge circuit work with a phase difference of 180°, which reduces the low-frequency ripple signal at the output.

Figure 14:
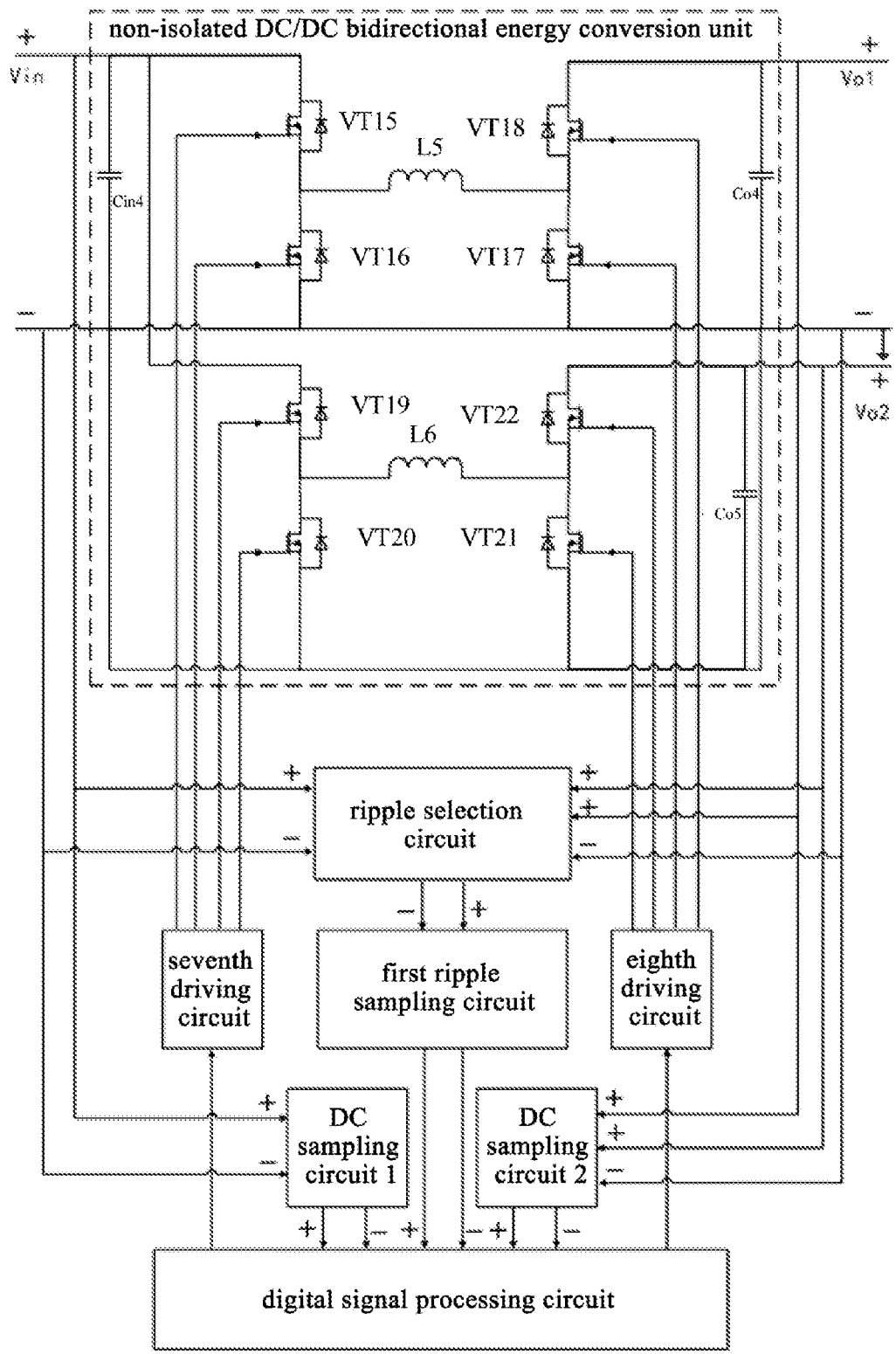
FIG. 14 is another compositional diagram of a non-isolated DC/DC bidirectional energy conversion unit according to an embodiment of the present application.

In Mode 24, as shown in FIG. 14, the non-isolated DC/DC bidirectional energy conversion unit 104 is implemented by using two H-bridge circuits, and the third H-bridge circuit includes: a fifteenth switching device VT15, a sixteenth switching device VT16, a seventeenth switching device VT17, an eighteenth switching device VT18, the fifth inductor L5, the fifteenth capacitor Cin4, and the sixteenth capacitor Co4. A drain of the fifteenth switching device VT15 is connected to the positive terminal of the first port, a source of the fifteenth switching device VT15 is simultaneously connected to one end of the fifth inductor L5 and a drain of the sixteenth switching device VT16, and a gate of the fifteenth switching device VT15 is connected to the first output port of the seventh drive circuit. A source of the sixteenth switch device VT16 is connected to the negative terminal of the first port, and a gate of the sixteenth switch device VT16 is connected to the second output port of the seventh drive circuit. The fifteenth capacitor Cin4 is connected in parallel between the positive and negative terminals of the first port, and a second end of the fifth inductor L5 is simultaneously connected to a drain of the seventeenth switching device VT17 and a source of the eighteenth switching device VT18. A source of the seventeenth switching device VT17 is connected to the negative terminal of the second port, and a gate of the seventeenth switching device VT17 is connected to the first output port of the eighth drive circuit. A drain of the eighteenth switch device VT18 is connected to the positive terminal of the second port, and a gate of the eighteenth switch device VT18 is connected to the second output port of the eighth drive circuit. The sixteenth capacitor Co4 is connected in parallel between the positive and negative terminals of the second port, the negative terminals of the two ports are grounded, and the negative terminal of the first port and the negative terminal of the second port are located on the same network.

The fourth H-bridge circuit includes: a nineteenth switch device VT19, a twentieth switch device VT20, a twenty-first switch device VT21, a twenty-second switch device VT22, a sixth inductor L6, and a seventeenth capacitor Co5. A drain of the nineteenth switching device VT19 is connected to the positive terminal of the first port, a source of the nineteenth switching device VT19 is simultaneously connected to one end of the sixth inductor L6 and a drain of the twentieth switch device VT20, and a gate of the nineteenth switching device VT19 is connected to the third output port of the seventh drive circuit. A source of the twentieth switch device VT20 is connected to the negative terminal of the first port, and a gate of the twentieth switch device VT20 is connected to the fourth output port of the seventh drive circuit. The other end of the sixth inductor L6 is simultaneously connected to a drain of the twenty-first switching device VT21 and a source of the twenty-second switching device VT22. A source of the twenty-first switching device VT21 is connected to the negative terminal of the third port, and a gate of the twenty-first switching device VT21 is connected to the third output port of the eighth drive circuit. A drain of the twenty-second switch device VT22 is connected to the positive terminal of the third port, and a gate of the fifteenth switch device VT15 is connected to the fourth output port of the eighth drive circuit. The negative terminal of the first port and the negative terminal of the third port are located on the same network.

It should be noted that, the non-isolated DC/DC bidirectional energy conversion units 104 illustrated above are merely some of achievable examples, and are not exhaustive list of implementations of the non-isolated DC/DC bidirectional energy conversion unit 104, and other implementations are also within the scope of the embodiments of the present application.

In an implementation, the ripple detection device further includes a driving unit 105 which is configured to drive switching devices in the non-isolated DC/DC bidirectional energy conversion unit according to a driving signal.

In an implementation, the driving signal may be generated by a dispatching system or by the digital signal processing unit. In the case that the driving signal is generated by the digital signal processing unit, the driving signal cannot directly drive the switching device; meanwhile, it is necessary to electrically isolate the driving signal generated by the digital signal processing unit from the switching devices in the non-isolated DC/DC bidirectional energy conversion unit for safety reasons; therefore, the drive unit is added to improve the driving capability and achieve isolation.

An embodiment of the present application further provides a ripple suppression device including the ripple detection device provided by the embodiment of the present application and a ripple suppression unit.

In an implementation, the ripple suppression unit is configured to: calculate a difference between a reference voltage signal and a digital signal corresponding to the ripple noise signal to obtain a first difference signal; calculate a difference between the first difference signal and a digital signal corresponding to the first voltage signal to obtain a second difference signal; and calculate a driving signal of each switching device in the non-isolated DC/DC bidirectional energy conversion unit according to the second difference signal, and output the calculated driving signal to a driving unit.

In another implementation, the ripple suppression unit is configured to: calculate a difference between the reference voltage signal and a digital signal corresponding to a low-frequency ripple signal to obtain a first difference signal; calculate a difference between the third difference signal and the digital signal corresponding to the first voltage signal to obtain a fourth difference signal; and calculate a driving signal of each switching device in the non-isolated DC/DC bidirectional energy conversion unit according to the fourth difference signal, and output the calculated driving signal to the driving unit.

The ripple suppression device provided by the embodiment of the present application adjusts the driving signal of each switching device in the non-isolated DC/DC bidirectional energy conversion unit based on the ripple noise signal or low-frequency ripple signal, so as to bring the first voltage at the output port back to the normal voltage value when the first voltage of the output port deviates from the normal voltage value, thereby realizing the suppression of the ripple noise signal or the low-frequency ripple signal.

In an implementation, the ripple suppression unit may realize the calculation of the driving signal of each switching device in the non-isolated DC/DC bidirectional energy conversion unit according to the second difference signal by: generating a digital triangular carrier signal; a frequency of the digital triangle carrier signal is the same as a frequency of the switching device; in response to the digital triangle carrier signal being greater than the second difference, the driving signal of the switching device is at a high level; in response to the digital triangle carrier signal being less than the second difference, the driving signal of the switching device is at a low level.

In an implementation, the peak value of the digital triangle carrier signal is determined according to the value range of the second difference.

In an implementation, the peak value of the digital triangle carrier signal is the maximum value in the value range of the second difference.

In an implementation, the ripple suppression unit may realize the calculation of the driving signal of each switching device in the non-isolated DC/DC bidirectional energy conversion unit according to the second difference signal by: generating a digital triangular carrier signal; a frequency of the digital triangle carrier signal is the same as the frequency of the switching device; in response to the digital triangle carrier signal being greater than the second difference, the driving signal of the switching device is at a low level; in response to the digital triangle carrier signal being less than the second difference, the driving signal of the switching device is at a high level.

In an implementation, the ripple suppression unit may realize the calculation of the driving signal of each switching device in the non-isolated DC/DC bidirectional energy conversion unit according to the fourth difference signal by: generating a digital triangular carrier signal; a frequency of the digital triangle carrier signal is the same as the frequency of the switching device; in response to the digital triangle carrier signal being greater than the fourth difference, the driving signal of the switching device is at a high level; in response to the digital triangle carrier signal being less than the fourth difference, the driving signal of the switching device is at a low level.

In an implementation, the peak value of the digital triangle carrier signal is determined according to the value range of the fourth difference.

In an implementation, the peak value of the digital triangle carrier signal is the maximum value in the value range of the fourth difference.

In an implementation, the ripple suppression unit may realize the calculation of the driving signal of each switching device in the non-isolated DC/DC bidirectional energy conversion unit according to the fourth difference signal by: generating a digital triangular carrier signal; a frequency of the digital triangle carrier signal is the same as the frequency of the switching device; in response to the digital triangle carrier signal being greater than the fourth difference, the driving signal of the switching device is at a low level; in response to the digital triangle carrier signal being less than the fourth difference, the driving signal of the switching device is at a high level.

In an implementation, the ripple suppression unit may be implemented by directly using the above digital signal processing unit, or may be implemented by other circuits.

Next, the determination of the drive signals of the switching devices in all the non-isolated DC/DC bidirectional energy conversion units illustrated above will be described, respectively.

(1) The Non-Isolated DC/DC Bidirectional Energy Conversion Unit Implemented Using the Above Mode 21.

Figure 15:
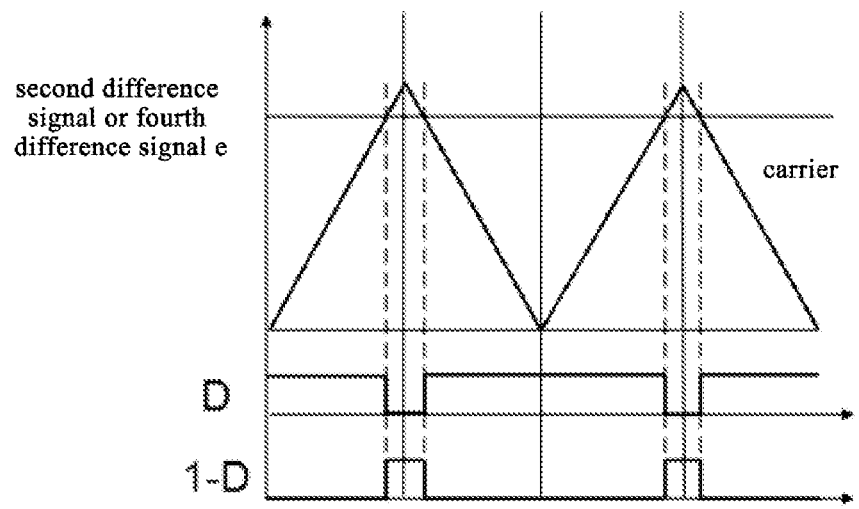
FIG. 15 is a schematic diagram of generating a driving signal based on a triangular carrier signal according to an embodiment of the present application.

The driving signal of the first switching device VT1 is set as follows: when the voltage is converted from Vin to Vo in a buck manner, VT1 works in the switching state with the driving signal corresponding to the duty cycle D in FIG. 15; when the voltage is converted from Vin to Vo in a boost manner, VT1 works in the normal on-state with the driving signal corresponding to the duty cycle 1; when the voltage is converted from Vo to Vin in a buck manner, VT1 works in the normal on-state with the driving signal corresponding to the duty cycle 1; when the voltage is converted from Vo to Vin in a boost manner, VT1 works in the switching state with the drive signal corresponding to the duty cycle D in FIG. 15.

The driving signal of the second switching device VT2 is set as follows: when the voltage is converted from Vin to Vo in a buck manner, VT2 works in the switching state with the driving signal corresponding to the duty cycle 1-D in FIG. 15; when the voltage is converted from Vin to Vo in a boost manner, VT2 works in the normal off-state with the driving signal corresponding to the duty cycle 0; when the voltage is converted from Vo to Vin in a buck manner, VT2 works in the normal off-state with the driving signal corresponding to the duty cycle 0; when the voltage is converted from Vo to Vin in a boost manner, VT2 works in the switching state with the drive signal corresponding to the duty cycle 1-D in FIG. 15.

The driving signal of the third switching device VT3 is set as follows: when the voltage is converted from Vin to Vo in a buck manner, VT3 works in the normal off-state with the driving signal corresponding to the duty cycle 0; when the voltage is converted from Vin to Vo in a boost manner, VT3 works in the switching state with the driving signal corresponding to the duty cycle D in FIG. 15; when the voltage is converted from Vo to Vin in a buck manner, VT3 works in the switching state with the driving signal corresponding to the duty cycle 1-D in FIG. 15; when the voltage is converted from Vo to Vin in a boost manner, VT3 works in the normal off-state with the drive signal corresponding to the duty cycle 0.

The driving signal of the fourth switching device VT4 is set as follows: when the voltage is converted from Vin to Vo in a buck manner, VT4 works in the normal on-state with the driving signal corresponding to the duty cycle 1; when the voltage is converted from Vin to Vo in a boost manner, VT4 works in the switching state with the driving signal corresponding to the duty cycle 1-D in FIG. 15; when the voltage is converted from Vo to Vin in a buck manner, VT4 works in the switching state with the driving signal corresponding to the duty cycle D in FIG. 15; when the voltage is converted from Vo to Vin in a boost manner, VT4 works in the normal on-state with the drive signal corresponding to the duty cycle 1.

(2) The Non-Isolated DC/DC Bidirectional Energy Conversion Unit Implemented Using the Above Mode 22.

The driving signal of the fifth switching device VT5 is set as follows: when the voltage is converted from Vin to Vo in a buck manner, VT5 works in the switching state with the driving signal corresponding to the duty cycle D in FIG. 15; when the voltage is converted from Vo to Vin in a boost manner, VT5 works in the switching state with the drive signal corresponding to the duty cycle 1-D in FIG. 15.

The driving signal of the sixth switching device VT6 is set as follows: when the voltage is converted from Vin to Vo in a buck manner, VT6 works in the switching state with the driving signal corresponding to the duty cycle 1-D in FIG. 15; when the voltage is converted from Vo to Vin in a boost manner, VT6 works in the switching state with the drive signal corresponding to the duty cycle D in FIG. 15.

(3) The Non-Isolated DC/DC Bidirectional Energy Conversion Unit Implemented Using the Above Mode 23.

The driving signal of the seventh switching device VT7 is set as follows: when the voltage is converted from Vin to Vo in a buck manner, VT7 works in the switching state with the driving signal corresponding to the duty cycle D in FIG. 15; when the voltage is converted from Vin to Vo in a boost manner, VT7 works in the normal on-state with the driving signal corresponding to the duty cycle 1; when the voltage is converted from Vo to Vin in a buck manner, VT7 works in the normal on-state with the driving signal corresponding to the duty cycle 1; when the voltage is converted from Vo to Vin in a boost manner, VT7 works in the switching state with the drive signal corresponding to the duty cycle D in FIG. 15.

The driving signal of the eighth switching device VT8 is set as follows: when the voltage is converted from Vin to Vo in a buck manner, VT8 works in the switching state with the driving signal corresponding to the duty cycle 1-D in FIG. 15; when the voltage is converted from Vin to Vo in a boost manner, VT8 works in the normal off-state with the driving signal corresponding to the duty cycle 0; when the voltage is converted from Vo to Vin in a buck manner, VT8 works in the normal off-state with the driving signal corresponding to the duty cycle 0; when the voltage is converted from Vo to Vin in a boost manner, VT8 works in the switching state with the drive signal corresponding to the duty cycle 1-D in FIG. 15.

The driving signal of the ninth switching device VT9 is set as follows: when the voltage is converted from Vin to Vo in a buck manner, VT9 works in the normal off-state with the driving signal corresponding to the duty cycle 0; when the voltage is converted from Vin to Vo in a boost manner, VT9 works in the switching state with the driving signal corresponding to the duty cycle D in FIG. 15; when the voltage is converted from Vo to Vin in a buck manner, VT9 works in the switching state with the driving signal corresponding to the duty cycle 1-D in FIG. 15; when the voltage is converted from Vo to Vin in a boost manner, VT9 works in the normal off-state with the drive signal corresponding to the duty cycle 0.

The driving signal of the tenth switching device VT10 is set as follows: when the voltage is converted from Vin to Vo in a buck manner, VT10 works in the normal on-state with the driving signal corresponding to the duty cycle 1; when the voltage is converted from Vin to Vo in a boost manner, VT10 works in the switching state with the driving signal corresponding to the duty cycle 1-D in FIG. 15; when the voltage is converted from Vo to Vin in a buck manner, VT10 works in the switching state with the driving signal corresponding to the duty cycle D in FIG. 15; when the voltage is converted from Vo to Vin in a boost manner, VT10 works in the normal on-state with the drive signal corresponding to the duty cycle 1.

The drive signal of the eleventh switching device VT11 is the same as that of the seventh switching device VT7, but their phase differs by 180°.

The drive signal of the twelfth switching device VT12 is the same as that of the eighth switching device VT8, but their phase differs by 180°.

The drive signal of the thirteenth switch device VT13 is the same as that of the ninth switch device VT9, but their phase differs by 180°.

The drive signal of the fourteenth switch device VT14 is the same as that of the tenth switch device VT10, but their phase differs by 180°.

(4) The Non-Isolated DC/DC Bidirectional Energy Conversion Unit Implemented Using the Above Mode 24.

The driving signal of the fifteenth switching device VT15 is set as follows: when the voltage is converted from Vin to Vo in a buck manner, VT15 works in the switching state with the driving signal corresponding to the duty cycle D in FIG. 15; when the voltage is converted from Vin to Vo in a boost manner, VT15 works in the normal on-state with the driving signal corresponding to the duty cycle 1; when the voltage is converted from Vo to Vin in a buck manner, VT15 works in the normal on-state with the driving signal corresponding to the duty cycle 1; when the voltage is converted from Vo to Vin in a boost manner, VT15 works in the switching state with the drive signal corresponding to the duty cycle D in FIG. 15.

The driving signal of the sixteenth switching device VT16 is set as follows: when the voltage is converted from Vin to Vo in a buck manner, VT16 works in the switching state with the driving signal corresponding to the duty cycle 1-D in FIG. 15; when the voltage is converted from Vin to Vo in a boost manner, VT16 works in the normal off-state with the driving signal corresponding to the duty cycle 0; when the voltage is converted from Vo to Vin in a buck manner, VT16 works in the normal off-state with the driving signal corresponding to the duty cycle 0; when the voltage is converted from Vo to Vin in a boost manner, VT16 works in the switching state with the drive signal corresponding to the duty cycle 1-D in FIG. 15.

The driving signal of the seventeenth switching device VT17 is set as follows: when the voltage is converted from Vin to Vo in a buck manner, VT17 works in the normal off-state with the driving signal corresponding to the duty cycle 0; when the voltage is converted from Vin to Vo in a boost manner, VT17 works in the switching state with the driving signal corresponding to the duty cycle D in FIG. 15; when the voltage is converted from Vo to Vin in a buck manner, VT17 works in the switching state with the driving signal corresponding to the duty cycle 1-D in FIG. 15; when the voltage is converted from Vo to Vin in a boost manner, VT9 works in the normal off-state with the drive signal corresponding to the duty cycle 0.

The driving signal of the eighth switching device VT18 is set as follows: when the voltage is converted from Vin to Vo in a buck manner, VT18 works in the normal on-state with the driving signal corresponding to the duty cycle 1; when the voltage is converted from Vin to Vo in a boost manner, VT18 works in the switching state with the driving signal corresponding to the duty cycle 1-D in FIG. 15; when the voltage is converted from Vo to Vin in a buck manner, VT18 works in the switching state with the driving signal corresponding to the duty cycle D in FIG. 15; when the voltage is converted from Vo to Vin in a boost manner, VT18 works in the normal on-state with the drive signal corresponding to the duty cycle 1.

The drive signal of the nineteenth switch device VT19 is the same as that of the fifteenth switch device VT15, and may have the same phase as or a different phase from the fifteenth switch device VT15.

The driving signal of the twentieth switch device VT20 is the same as that of the sixteenth switch device VT16, and may have the same phase as or a different phase from the sixteenth switch device VT16.

The driving signal of the twenty-first switching device VT21 is the same as that of the seventeenth switching device VT17, and may have the same phase as or a different phase from the seventeenth switching device VT17.

The driving signal of the twenty-second switching device VT22 is the same as that of the eighteenth switching device VT18, and may have the same phase as or a different phase from the eighteenth switching device VT18.

The ripple suppression device provided by the embodiment of the present application uses a negative feedback loop to adjust the output voltage, and the frequency of the low-frequency ripple signal is much greater than the switching frequencies of the switching devices in the non-isolated DC/DC bidirectional energy conversion unit; therefore, when the first voltage at the output port is away from the normal voltage value in the positive direction, the second difference signal or the fourth difference signal will be reduced, which decreases the duty cycle of the switching device working in the switching state, thereby bringing the output voltage back to the normal voltage; conversely, when the first voltage of the output port is away from the normal voltage value in the negative direction, the second difference signal or fourth difference signal will be increased, which increases the duty cycle of the switching device working in the switching state, thereby bringing the output voltage back to the normal voltage.

It will be appreciated for those of ordinary skill in the art that all or some of the steps of the methods disclosed above, the functional modules/units in the systems of the devices may be implemented as software, firmware, hardware and appropriate combinations thereof. In hardware implementations, the division among the functional modules/units mentioned in the above description does not necessarily correspond to the division of physical components; for example, a physical component may have multiple functions, or a function or step may be performed by several physical components cooperatively. Some physical components or all physical components may be implemented as software executed by a processor, such as a central processing unit, digital signal processor or microprocessor, or as hardware, or as an integrated circuit, such as an application-specific integrated circuit. Such software may be distributed on computer-readable media, which may include computer storage media (or non-transient media) and communication media (or transient media). As is well known to those of ordinary skill in the art, the term computer storage medium includes volatile and non-volatile, removable and non-removable medium implemented in any method or technique for storing information (such as computer-readable instructions, data structures, program modules or other data). The computer storage medium include, but is not limited to, RAM (Random Access Memory), ROM (Read-Only Memory), EEPROM (Electrically Erasable Programmable Read Only Memory), flash memory or other memory technology, CD-ROM, Digital multifunction disk (DVD) or other optical disk storage, magnetic cassette, tape, disk storage or other magnetic memory, or any other medium that may be used to store desired information and can be accessed by a computer. Further, it is well known for those of ordinary skill in the art that the communication medium typically includes computer-readable instructions, data structures, program modules, or other data in a modulated data signal such as a carrier or other transmission mechanism, and may include any information delivery medium.

Exemplary embodiments have been disclosed herein, and although specific terms are used, they are used for and should be interpreted as general illustrative meanings only, and are not intended for limiting purposes. In some examples, it is obvious to those skilled in the art that, unless expressly stated otherwise, the features, characteristics and/or elements described in conjunction with a particular embodiment may be used alone, or may be used in combination with other features, characteristics and/or elements described in conjunction with other embodiments. Accordingly, it will be appreciated for those of ordinary skill in the art that various forms and details may be modified without departing from the scope of the present application set forth by the appended claims.

What is claimed is:

1. A ripple detection device, comprising: a ripple sampling unit, at least two DC sampling units, and a digital signal processing unit,
   wherein the ripple sampling unit includes at least two input ports and an output port, an i-th input port of the ripple sampling unit is connected to an i-th port of a non-isolated DC/DC bidirectional energy conversion unit, and the output port of the ripple sampling unit is connected to an input port of the digital signal processing unit, where i is an integer greater than or equal to 1;
   one of the at least two DC sampling units includes an input port and an output port, the input port of the DC sampling unit is connected to a port of the non-isolated DC/DC bidirectional energy conversion unit, and the output port of the DC sampling unit is connected to an input port of the digital signal processing unit;

wherein the ripple sampling unit is configured to output a first voltage signal at an output port of the non-isolated DC/DC bidirectional energy conversion unit to the digital signal processing unit;

each of the DC sampling units is configured to output a first DC signal in a second voltage signal at the connected port of the non-isolated DC/DC bidirectional energy conversion unit to the digital signal processing unit, and to block an AC signal in the second voltage signal to be output to the digital signal processing unit;

the digital signal processing unit is configured to determine a ripple noise signal at the output port of the non-isolated DC/DC bidirectional energy conversion unit according to the first voltage signal and the first DC signal.

2. The ripple detection device according to claim 1, wherein the ripple sampling unit comprises: a ripple selection circuit and a first ripple sampling circuit, wherein the ripple selection circuit includes at least two input ports and an output port, an i-th input port of the ripple selection circuit is connected to an i-th port of the non-isolated DC/DC bidirectional energy conversion unit, and the output port of the ripple selection circuit is connected to an input port of the first ripple sampling circuit; the first ripple sampling circuit includes one input port and one output port, the output port of the first ripple sampling circuit is connected to an input port of the digital signal processing unit;

wherein, the ripple selection circuit is configured to output the first voltage signal to the first ripple sampling circuit under the control of the digital signal processing unit;

the first ripple sampling circuit is configured to output the first voltage signal to the digital signal processing unit;

the digital signal processing unit is further configured to control the ripple selection circuit to output the first voltage signal to the first ripple sampling circuit.

3. The ripple detection device according to claim 2, wherein the ripple selection circuit comprises at least two control switch groups, and each of the at least two control switch groups comprises two sub-switches;

wherein one of the sub-switches in a j-th control switch group is connected in series in a loop between a positive terminal of a j-th port of the non-isolated DC/DC bidirectional energy conversion unit and a positive terminal of the input port of the first ripple sampling circuit, and the other sub-switch in the j-th control switch group is connected in series in a loop between a negative terminal of the j-th port of the non-isolated DC/DC bidirectional energy conversion unit and a negative terminal of the input port of the first ripple sampling circuit, where j is an integer greater than or equal to 1.

4. The ripple detection device according to claim 2, wherein the ripple selection circuit comprises a first single-pole double-throw selection switch and a second single-pole double-throw selection switch;

wherein each of the first and second single-pole double-throw selection switches includes: a first contact, a second contact, a third contact, and a switching tab;

an end of the switching tab is connected to the third contact, and another end of the switching tab is switched between the first contact and the second contact;

the first contact of the first single-pole double-throw selection switch is connected to a negative terminal of one of the ports of the non-isolated DC/DC bidirectional energy conversion unit, the second contact of the first single-pole double-throw selection switch is connected to a negative terminal of the other port of the non-isolated DC/DC bidirectional energy conversion unit, and the third contact of the first single-pole double-throw selection switch is connected to a negative terminal of the input port of the first ripple sampling circuit; the first contact of the second single-pole double-throw selection switch is connected to a positive terminal of one of the ports of the non-isolated DC/DC bidirectional energy conversion unit, the second contact of the second single-pole double-throw selection switch is connected to a positive terminal of the other port of the non-isolated DC/DC bidirectional energy conversion unit, and the third contact of the second single-pole double-throw selection switch is connected to a positive terminal of the input port of the first ripple sampling circuit.

5. The ripple detection device according to claim 2, wherein the first ripple sampling circuit is specifically configured to: amplify and DC bias the first voltage signal to obtain a third voltage signal, perform low-pass filtering on the third voltage signal to obtain a fourth voltage signal, and output the fourth voltage signal to the digital signal processing unit.

6. The ripple detection device according to claim 5, wherein the first ripple sampling circuit comprises: a first differential proportional amplification circuit, a first DC bias circuit and a first low-pass filter circuit;

wherein the first differential proportional amplification circuit includes: a first DC differential amplification circuit and a first AC differential amplification circuit;

wherein the first DC differential amplification circuit includes: a first resistor, a second resistor, a third resistor, a fourth resistor, a fifth resistor, a sixth resistor, an eighth resistor and a first operational amplifier, wherein an end of the first resistor is connected to a positive terminal of the output port of the ripple selection circuit, another end of the first resistor is connected to an end of the third resistor, and another end of the third resistor is connected to a positive terminal of an input port of the first operational amplifier; an end of the second resistor is connected to a negative terminal of the output port of the ripple selection circuit, another end of the second resistor is connected to an end of the fourth resistor, and another end of the fourth resistor is connected to a negative terminal of the input port of the first operational amplifier; a power supply terminal of the first operational amplifier is connected to a first power supply, and a ground terminal of the first operational amplifier is grounded; an end of the fifth resistor is grounded, another end of the fifth resistor is connected to an end of the sixth resistor and the positive terminal of the input port of the first operational amplifier, and another end of the sixth resistor is connected to the first power supply; an end of the eighth resistor is connected to the negative terminal of the input port of the first operational amplifier, and another end of the eighth resistor is connected to an output port of the first operational amplifier;

wherein the first AC differential amplification circuit includes: a first capacitor, a second capacitor, a third capacitor, a fourth capacitor, the third resistor, the fourth resistor, the fifth resistor, the eighth resistor and the first operational amplifier; wherein the first capacitor is connected in parallel with the first resistor, the second capacitor is connected in parallel with the fifth resistor, the third capacitor is connected in parallel with the second resistor, and the fourth capacitor is connected in parallel with the eighth resistor;

wherein the first DC bias circuit includes: the fifth resistor, the sixth resistor, and the first power supply;

wherein the first low-pass filter circuit includes: a seventh resistor, a ninth resistor and a fifth capacitor; wherein an end of the seventh resistor is connected to the negative terminal of the input port of the first operational amplifier, another end of the seventh resistor is grounded, an end of the ninth resistor is connected to the output port of the first operational amplifier, another end of the ninth resistor is simultaneously connected to an end of the fifth capacitor and the output port of the first ripple sampling circuit, and another end of the fifth capacitor is grounded.

7. The ripple detection device according to claim 6, wherein the first ripple sampling circuit further comprises a first clamp protection circuit, and the first clamp protection circuit comprises: a first diode, a second diode, a third diode, a fourth diode; wherein a cathode of the first diode is connected to the first power supply, an anode of the first diode is connected to a cathode of the second diode and the positive terminal of the input port of the first operational amplifier, an anode of the second diode is grounded, a cathode of the third diode is connected to the first power supply, an anode of the third diode is connected to a cathode of the fourth diode and the negative terminal of the input port of the first operational amplifier, and an anode of the fourth diode is grounded.

8. The ripple detection device according to claim 2, wherein each of the DC sampling units is specifically configured to: amplify and DC bias the first DC signal in the second voltage signal to obtain a second DC signal, perform low-pass filtering on the second DC signal to obtain a third DC signal, and output the third DC signal to the digital signal processing unit; and to block the AC signal in the second voltage signal to be output to the digital signal processing unit.

9. The ripple detection device according to claim 8, wherein each of the DC sampling units comprises: a second differential proportional amplification circuit, a second DC bias circuit and a second low-pass filter circuit;

wherein the second differential proportional amplification circuit includes: a tenth resistor, an eleventh resistor, a twelfth resistor, a thirteenth resistor, a fourteenth resistor, a fifteenth resistor, a seventeenth resistor and a second operational amplifier; wherein an end of the tenth resistor is connected to a positive terminal of the output port of the ripple selection circuit, another end of the tenth resistor is connected to an end of the twelfth resistor, and another end of the twelfth resistor is connected to a positive terminal of an input port of the second operational amplifier; an end of the eleventh resistor is connected to a negative terminal of the output port of the ripple selection circuit, another end of the eleventh resistor is connected to an end of the thirteenth resistor, and another end of the thirteenth resistor is connected to a negative terminal of the input port of the second operational amplifier; a power supply terminal of the second operational amplifier is connected to a second power supply, and a ground terminal of the second operational amplifier is grounded; an end of the fourteenth resistor is grounded, another end of the fourteenth resistor is connected to an end of the fifteenth resistor and the positive terminal of the input port of the second operational amplifier, and another end of the fifteenth resistor is connected to the second power supply; an end of the seventeenth resistor is connected to the negative terminal of the input port of the second operational amplifier, and another end of the seventeenth resistor is connected to an output port of the second operational amplifier;

wherein the second DC bias circuit includes: the fourteenth resistor, the fifteenth resistor, and the second power supply;

wherein the second low-pass filter circuit includes: a sixteenth resistor, an eighteenth resistor and an eighth capacitor; wherein an end of the sixteenth resistor is connected to the negative terminal of the input port of the second amplifier, another end of the sixteenth resistor is grounded, an end of the eighteenth resistor is connected to the output port of the second operational amplifier, another end of the eighteenth resistor is connected simultaneously with an end of the eighth capacitor and the output port of the first ripple sampling circuit, and another end of the eighth capacitor is grounded.

10. The ripple detection device according to claim 9, wherein the DC sampling unit further comprises: a fifth diode, a sixth diode, a seventh diode, and an eighth diode; wherein a cathode of the fifth diode is connected to the second power supply, an anode of the fifth diode is connected to a cathode of the sixth diode and the positive terminal of the input port of the second operational amplifier, an anode of the sixth diode is grounded, a cathode of the seventh diode is connected to the second power supply, an anode of the seventh diode is connected to a cathode of the eighth diode and the negative terminal of the input port of the second operational amplifier, and an anode of the eighth diode is grounded.

11. The ripple detection device according to claim 1, wherein the ripple sampling unit comprises at least two second ripple sampling circuits;

wherein one of the at least two second ripple sampling circuits includes an input port and an output port, the input port of the second ripple sampling circuit is connected to a port of the non-isolated DC/DC bidirectional energy conversion unit, and the output port of the second ripple sampling circuit is connected to an input port of the digital signal processing unit;

wherein, the second ripple sampling circuit is configured to output the fifth voltage signal of the connected port of the non-isolated DC/DC bidirectional energy conversion unit to the digital signal processing unit;

the digital signal processing unit is further configured to: select one of the fifth voltage signals output by all the second ripple sampling circuits, as the first voltage signal.

12. A ripple suppression device, comprising the ripple detection device according to claim 1, and a ripple suppression unit;

wherein the ripple suppression unit is configured to:

calculate a difference between a reference voltage signal and a digital signal corresponding to the ripple noise signal to obtain a first difference signal; calculate a difference between the first difference signal and a digital signal corresponding to the first voltage signal to obtain a second difference signal; calculate a driving signal of each switching device in the non-isolated DC/DC bidirectional energy conversion unit according to the second difference signal, and output the driving signal to a driving unit; or calculate a difference between the reference voltage signal and a digital signal corresponding to a low-frequency ripple signal to obtain a first difference signal; calculate a difference between the third difference signal and the digital signal corresponding to the first voltage signal to obtain a fourth difference signal; calculate a driving signal of each switching device in the non-isolated DC/DC bidirectional energy conversion unit according to the fourth difference signal, and output the driving signal to the driving unit.

13. The ripple suppression device according to claim 12, wherein the ripple suppression unit is specifically configured to realize the calculation of the driving signal of each switching device in the non-isolated DC/DC bidirectional energy conversion unit according to the second difference signal by:
generating a digital triangular carrier signal, wherein a frequency of the digital triangle carrier signal is the same as a frequency of the switching device; in response to the digital triangle carrier signal being greater than the second difference, the driving signal of the switching device is at a high level; in response to the digital triangle carrier signal being less than the second difference, the driving signal of the switching device is at a low level.

14. The ripple suppression device according to claim 12, wherein the ripple suppression unit is specifically configured to realize the calculation of the driving signal of each switching device in the non-isolated DC/DC bidirectional energy conversion unit according to the second difference signal by:
generating a digital triangular carrier signal, wherein a frequency of the digital triangle carrier signal is the same as a frequency of the switching device; in response to the digital triangle carrier signal being greater than the second difference, the driving signal of the switching device is at a low level; in response to the digital triangle carrier signal being less than the second difference, the driving signal of the switching device is at a high level.

15. The ripple suppression device according to claim 12, wherein the ripple suppression unit is specifically configured to realize the calculation of the driving signal of each switching device in the non-isolated DC/DC bidirectional energy conversion unit according to the fourth difference signal by:
generating a digital triangular carrier signal, wherein a frequency of the digital triangle carrier signal is the same as a frequency of the switching device; in response to the digital triangle carrier signal being greater than the fourth difference, the driving signal of the switching device is at a high level; in response to the digital triangle carrier signal being less than the fourth difference, the driving signal of the switching device is at a low level.

16. The ripple suppression device according to claim 12, wherein the ripple suppression unit is specifically configured to realize the calculation of the driving signal of each switching device in the non-isolated DC/DC bidirectional energy conversion unit according to the fourth difference signal by:
generating a digital triangular carrier signal, wherein a frequency of the digital triangle carrier signal is the same as a frequency of the switching device; in response to the digital triangle carrier signal being greater than the fourth difference, the driving signal of the switching device is at a low level; in response to the digital triangle carrier signal being less than the fourth difference, the driving signal of the switching device is at a high level.

\* \* \* \* \*